(12) United States Patent
Lee et al.

(10) Patent No.: US 10,763,399 B2
(45) Date of Patent: Sep. 1, 2020

(54) LIGHT EMITTING DEVICE PACKAGE

(71) Applicant: SAMSUNG ELECTRONICS CO., LTD., Suwon-si, Gyeonggi-do (KR)

(72) Inventors: Dong Gun Lee, Hwaseong-si (KR); Yong Il Kim, Seoul (KR); Young Soo Park, Yongin-si (KR); Jin Sub Lee, Suwon-si (KR); Wan Tae Lim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 194 days.

(21) Appl. No.: 15/684,144

(22) Filed: Aug. 23, 2017

(65) Prior Publication Data

US 2018/0182931 A1   Jun. 28, 2018

(30) Foreign Application Priority Data

Dec. 27, 2016 (KR) .................. 10-2016-0180157

(51) Int. Cl.
*H01L 33/12* (2010.01)
*H01L 33/46* (2010.01)
(Continued)

(52) U.S. Cl.
CPC .......... *H01L 33/50* (2013.01); *H01L 25/0753* (2013.01); *H01L 33/44* (2013.01); *H01L 33/46* (2013.01); *H01L 33/504* (2013.01)

(58) Field of Classification Search
CPC ... H01L 33/60; H01L 25/0753; H01L 33/405; H01L 33/50; H01L 33/504;
(Continued)

(56) References Cited

U.S. PATENT DOCUMENTS 6,372,608 B1   4/2002  Shimoda et al.
6,645,830 B2  11/2003  Shimoda et al.
(Continued)

FOREIGN PATENT DOCUMENTS

| CN | 103840040 A | 6/2014 |
|---|---|---|
| KR | 10-1649237 B1 | 8/2016 |
| KR | 10-2017-0099650 A | 9/2017 |

OTHER PUBLICATIONS

Chinese Office action dated Aug. 5, 2019 for corresponding Chinese Application No. 201711445437.6.

*Primary Examiner* — Bradley Smith
*Assistant Examiner* — David J Goodwin
(74) *Attorney, Agent, or Firm* — Lee IP Law, P.C.

(57) ABSTRACT

A light emitting device package includes a light emitting structure including a first light emitting cell, a second light emitting cell, and a third light emitting cell, each of the first to third light emitting cells including an active layer to emit light of a first wavelength in a first direction and being separated from each other in a second direction, orthogonal to the first direction, a first light adjusting portion including a first wavelength conversion layer in a first recess portion of the first light emitting cell, the first wavelength conversion layer to convert light of the first wavelength to light of a second wavelength, and a second light adjusting portion including a second wavelength conversion layer in a second recess portion of the second light emitting cell, the second wavelength conversion layer to convert light of the first wavelength to light of a third wavelength.

20 Claims, 28 Drawing Sheets

(51) Int. Cl.
*H01L 27/15* (2006.01)
*H01L 33/50* (2010.01)
*H01L 25/075* (2006.01)
*H01L 33/44* (2010.01)

(58) Field of Classification Search
CPC .......... H01L 2933/0041; H01L 33/502; H01L 27/322; H01L 33/10
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,664,847 B2* | 3/2014 | Groetsch | H01L 33/508 313/502 |
| 8,735,931 B2 | 5/2014 | Han et al. | |
| 8,766,295 B2 | 7/2014 | Kim | |
| 9,343,631 B2 | 5/2016 | Lee et al. | |
| 9,450,155 B2 | 9/2016 | Jung et al. | |
| 9,995,958 B2* | 6/2018 | Park | G02F 1/133617 |
| 2013/0105845 A1* | 5/2013 | Kim | H01L 27/156 257/98 |
| 2014/0138722 A1 | 5/2014 | Yamada et al. | |
| 2015/0108492 A1* | 4/2015 | Kuo | H01L 33/382 257/76 |
| 2015/0333230 A1* | 11/2015 | Moon | H01L 33/46 257/88 |
| 2015/0333241 A1* | 11/2015 | Chen | H01L 33/62 257/93 |
| 2015/0362165 A1* | 12/2015 | Chu | H01L 25/0753 362/235 |
| 2016/0059221 A1 | 3/2016 | Brazdil et al. | |
| 2016/0204318 A1 | 7/2016 | Shin et al. | |
| 2017/0244010 A1 | 8/2017 | Kim et al. | |
| 2018/0130924 A1* | 5/2018 | Ko | H01L 33/0079 |
| 2019/0123033 A1* | 4/2019 | Martin | H01L 25/18 |

* cited by examiner

LIGHT EMITTING DEVICE PACKAGE

CROSS-REFERENCE TO RELATED APPLICATION

Korean Patent Application No. 10-2016-0180157, filed on Dec. 27, 2016 in the Korean Intellectual Property Office, and entitled: "Light Emitting Device Package," is incorporated by reference herein in its entirety.

BACKGROUND

1. Field

Embodiments relate to a light emitting device package.

2. Description of the Related Art

Semiconductor light emitting devices are next-generation light sources possessing several advantages, e.g., relatively long lifespan, low power consumption, fast response speed, low environmental impact, and the like. Semiconductor light emitting devices may be used in various types of products, e.g., lighting devices and backlights for displays. In particular, a nitride-based light emitting device based on a Group III nitride, e.g., GaN, AlGaN, InGaN, or InAlGaN, may serve an important function in outputting blue or ultraviolet light as a semiconductor light emitting device.

Accordingly, as the use of a light emitting diode (LED) extends into various fields to be used as a lighting device, a compact light emitting device package has been demanded, in order to secure a degree of design freedom in its applications.

SUMMARY

According to an example embodiment, a light emitting device package may include: a light emitting structure including a first light emitting cell and a second light emitting cell, and having a first surface and a second surface opposing each other; an insulating layer covering a lateral surface of the first light emitting cell and a lateral surface of the second light emitting cell; a reflective layer disposed on the insulating layer and covering a lateral surface of the first light emitting cell and a lateral surface of the second light emitting cell; a first light adjusting portion disposed in a first recess portion of the first light emitting cell provided in the second surface of the light emitting structure, the first light adjusting portion being configured to provide red light; and a second light adjusting portion disposed in a second recess portion of the second light emitting cell provided in the second surface of the light emitting structure, the second light adjusting portion being configured to provide green light.

According to an example embodiment, a light emitting device package may include: a light emitting structure including a first light emitting cell, a second light emitting cell, and a third light emitting cell; an insulating layer disposed between the first light emitting cell, the second light emitting cell, and the third light emitting cell, to separate the first light emitting cell, the second light emitting cell, and the third light emitting cell from one another; a reflective layer disposed on the insulating layer and covering a lateral surface of the first light emitting cell and a lateral surface of the second light emitting cell; a first light adjusting portion including a first wavelength conversion layer, having a red quantum dot, and disposed in a first recess portion of the first light emitting cell; a second light adjusting portion including a second wavelength conversion layer, having a green quantum dot, and disposed in a second recess portion of the second light emitting cell; and a protective layer covering the first light adjusting portion and the second light adjusting portion, and disposed on the first light emitting cell, the second light emitting cell, and the third light emitting cell.

According to an example embodiment, a light emitting device package may include: a light emitting structure including a first light emitting cell, a second light emitting cell, and a third light emitting cell; an insulating layer disposed between the first light emitting cell, the second light emitting cell, and the third light emitting cell to separate the first light emitting cell, the second light emitting cell, and the third light emitting cell from one another; a reflective layer disposed on the insulating layer and covering a lateral surface of the first light emitting cell and a lateral surface of the second light emitting cell; a first wavelength conversion layer having a red quantum dot, and disposed in a first recess portion of the first light emitting cell; a first distributed Bragg reflector (DBR) layer disposed on the first wavelength conversion layer to reflect light emitted by the first light emitting cell; a first light filter layer disposed on the first DBR layer to block light emitted by the first light emitting cell; a second DBR layer disposed on the second wavelength conversion layer to reflect light emitted by the second light emitting cell; a second light filter layer disposed on the second DBR layer to block light emitted by the second light emitting cell; and a protective layer covering the first light filter layer and the second light filter layer, and disposed on the first light emitting cell, the second light emitting cell, and the third light emitting cell.

According to an example embodiment, a light emitting device package may include a light emitting structure including a first light emitting cell, a second light emitting cell, and a third light emitting cell, each of the first to third light emitting cells including an active layer to emit light of a first wavelength in a first direction and being separated from each other in a second direction, orthogonal to the first direction, a first light adjusting portion including a first wavelength conversion layer in a first recess portion of the first light emitting cell, the first wavelength conversion layer to convert light of the first wavelength to light of a second wavelength, and a second light adjusting portion including a second wavelength conversion layer in a second recess portion of the second light emitting cell, the second wavelength conversion layer to convert light of the first wavelength to light of a third wavelength.

According to an example embodiment, a light emitting device package may include a light emitting structure including a first light emitting cell to emit light of a first wavelength and a second light emitting cell to emit light of a second wavelength, different from the first wavelength, wherein each of the first and second light emitting cells includes a first semiconductor layer, an active layer, and a second semiconductor layer, sequentially stacked, a first electrode on a bottom surface of the first semiconductor layer, and a second electrode on a bottom surface of an active second semiconductor layer, an insulating layer covering lateral surfaces of the first light emitting cell and lateral surfaces of the second light emitting cell, and a reflective layer on the insulating layer and covering a lateral surface of the first light emitting cell and a lateral surface of the second light emitting cell, the reflective layer being separated from the first light emitting cell and the second light emitting cell by the insulating layer, wherein the reflective layer extends below the first and second light emitting cells, contacts the first electrodes, and serves as a common electrode.

BRIEF DESCRIPTION OF DRAWINGS

Features will become apparent to those of skill in the art by describing in detail exemplary embodiments with reference to the attached drawings in which.

DETAILED DESCRIPTION

Hereinafter, exemplary embodiments of the present disclosure will be described in detail with reference to the attached drawings.

Figure 1:
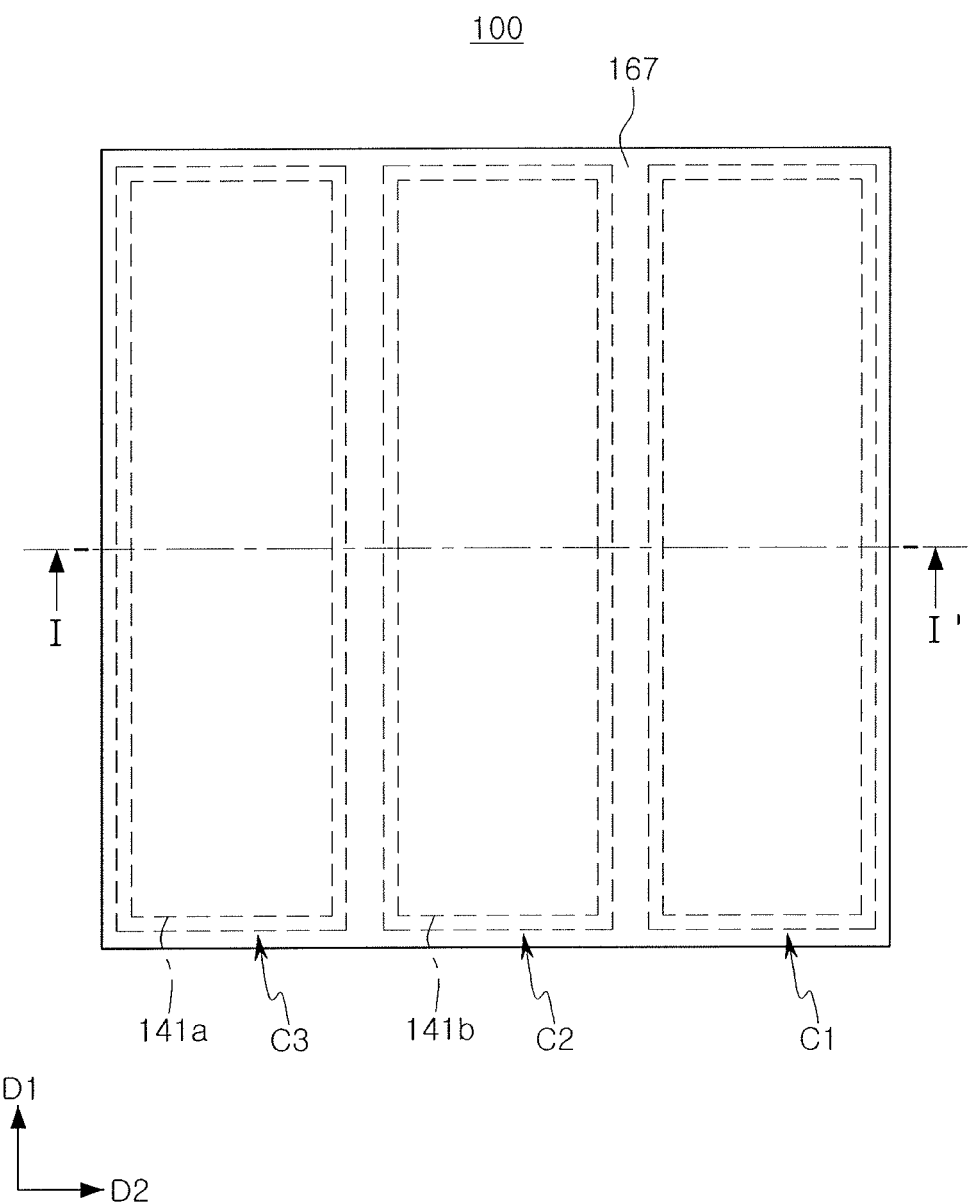
FIG. 1 illustrates a schematic plan view of a light emitting device package according to an example embodiment.
Figure 2:
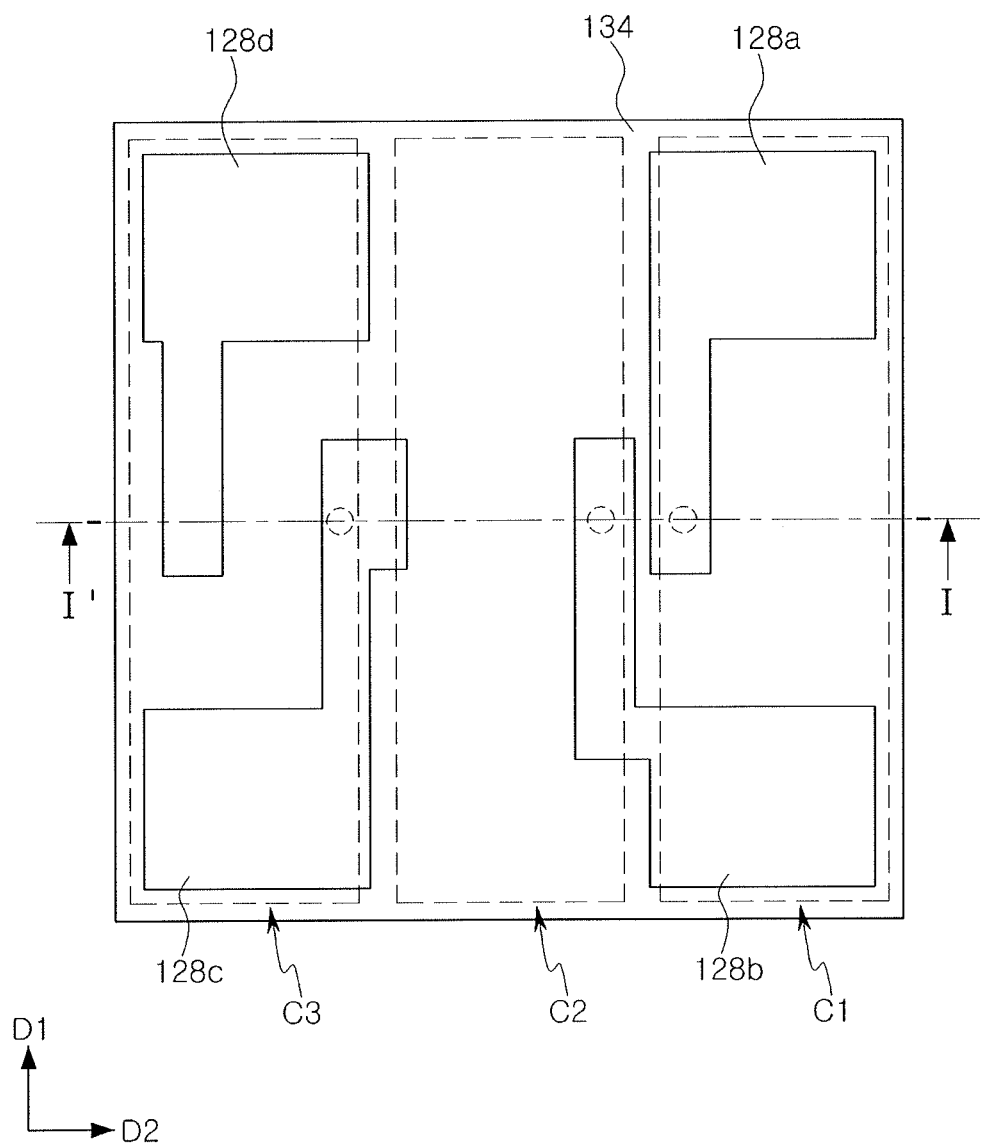
FIG. 2 illustrates a schematic rear view of a light emitting device package according to an example embodiment.
Figure 3:
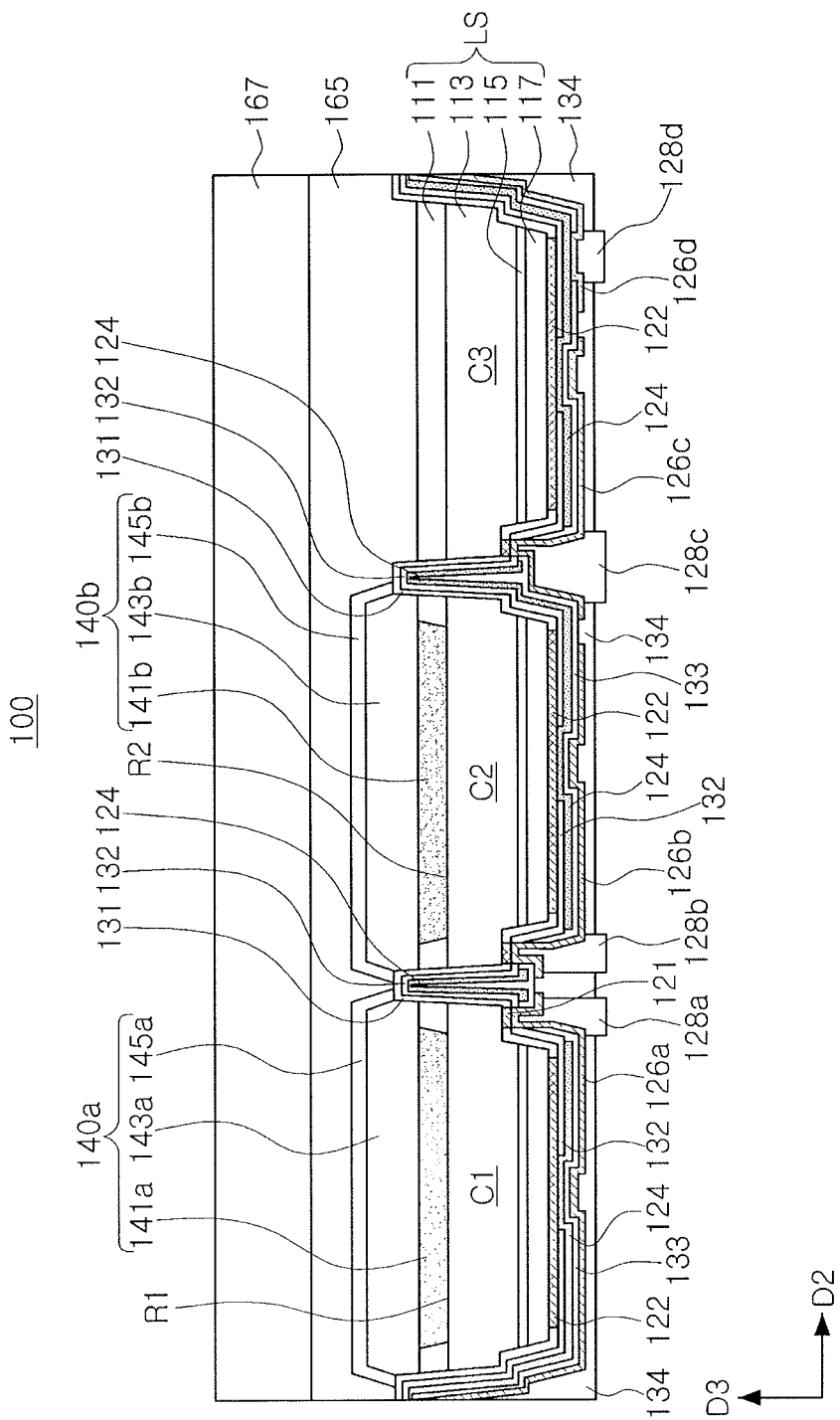
FIG. 3 illustrates a cross-sectional view taken along line I-I' of the light emitting device package in FIG. 1.
Figure 4:
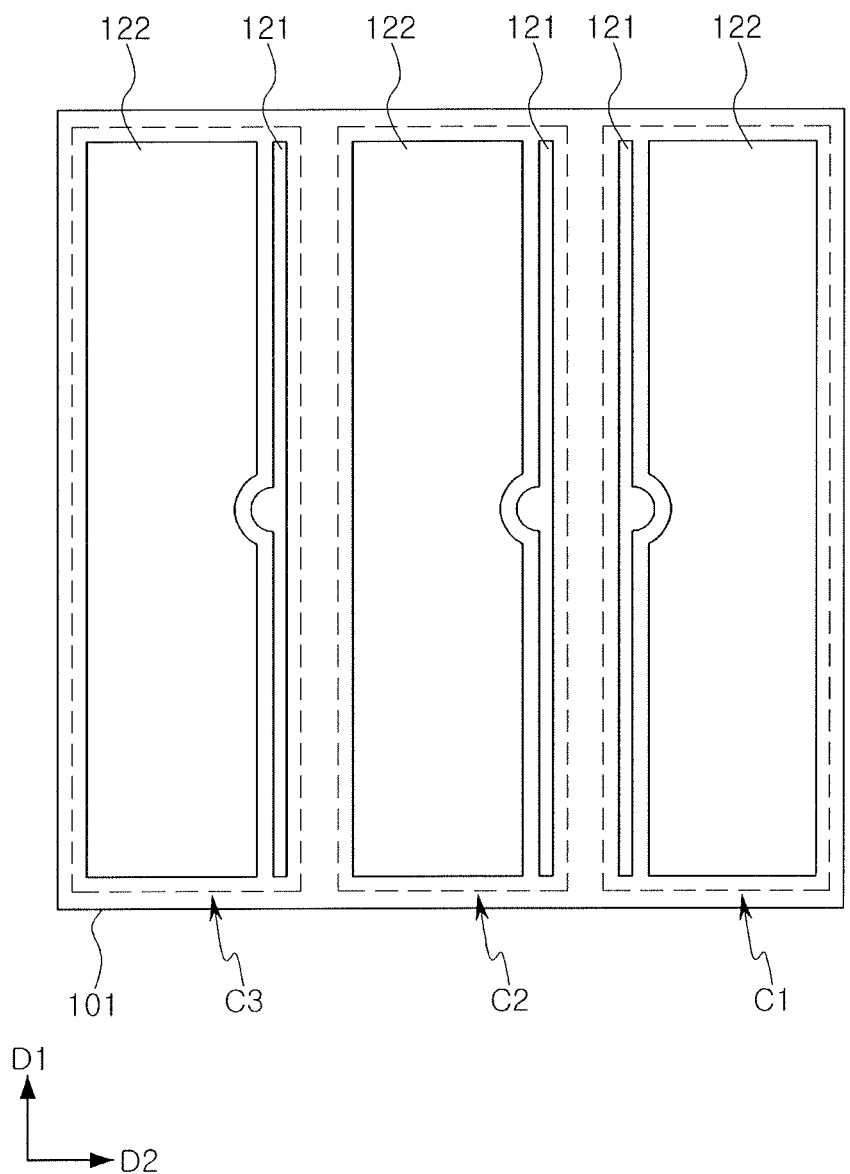
FIGS. 4 through 6 illustrate views of an electrode and a pad of the light emitting device package in FIG. 1.
Figure 5:
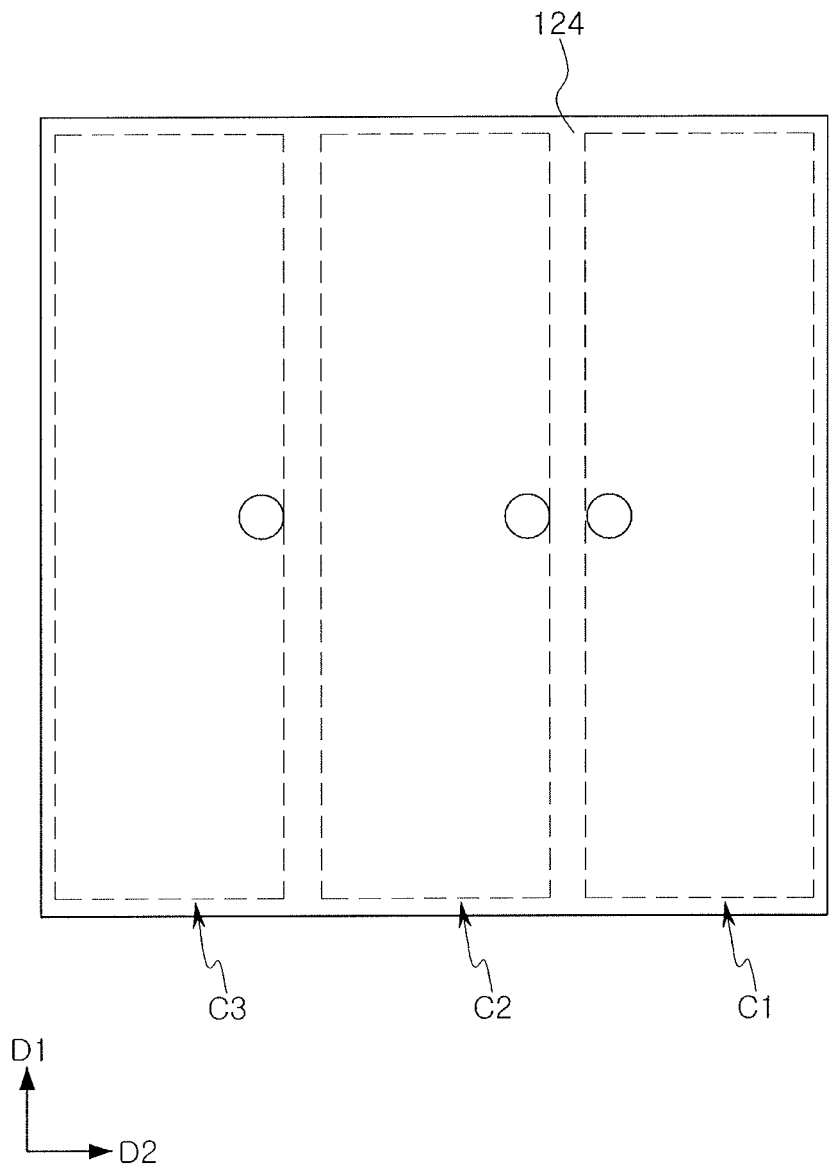
Figure 6:
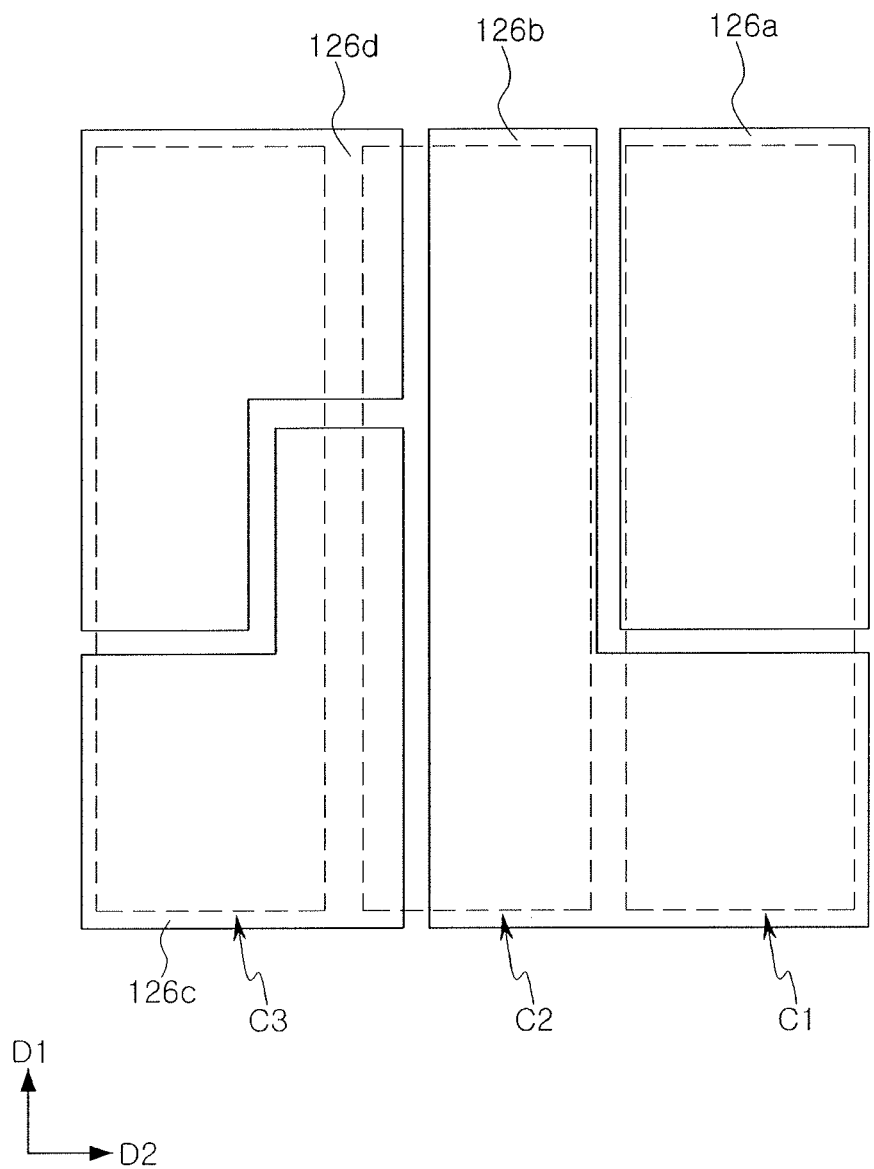

FIG. 1 is a schematic plan view of a light emitting device package 100 according to an example embodiment. FIG. 2 is a schematic rear view of the light emitting device package 100 according to an example embodiment. FIG. 3 is a cross-sectional view taken along line I-I' of the light emitting device package 100 in FIG. 1. FIGS. 4 through 6 illustrate views of an electrode and a pad of the light emitting device package in FIG. 1.

Referring to FIGS. 1 through 3, the light emitting device package 100 according to an example embodiment may include first to third light emitting cells C1 to C3, first to fourth insulating layers 131 to 134, first electrodes 121, second electrodes 122, a reflective layer 124, first to fourth base pads 126a to 126d, first to fourth electrode pads 128a to 128d, first and second light adjusting portions 140a and 140b, a protective layer 167, and a light-transmitting bonding layer 165.

In detail, the light emitting device package 100 may include a light emitting structure LS, including a buffer layer 111, a first conductivity-type semiconductor layer 113, an active layer 115, and a second conductivity-type semiconductor layer 117, e.g., sequentially stacked along a third direction D3. For example, the first conductivity-type semiconductor layer 113 may be an n-type semiconductor layer and the second conductivity-type semiconductor layer 117 may be a p-type semiconductor layer. The active layer 115 may have a multiple quantum well (MQW) structure.

The light emitting structure LS may be divided into three light emitting cells C1, C2, and C3 by the first and second insulating layers 131 and 132. The light emitting structure LS may also be divided into the three light emitting cells C1, C2, and C3 by the reflective layer 124, in addition to the first and second insulating layers 131 and 132. For example, the first and second insulating layers 131 and 132 and the reflective layer 124 may be in an isolation region between adjacent light emitting cells C1, C2, and C3.

The light emitting structure LS may have a first surface provided by the second conductivity-type semiconductor layer 117, e.g., a bottom of the light emitting structure LS may be a bottom surface of the second conductivity-type semiconductor layer 117, and a second surface provided by the buffer layer 111, e.g., a top of the light emitting structure LS may be a top surface of the buffer layer 111, and opposing the first surface. In other words, layers of the light emitting structure LS may be stacked along the third direction D3, with the second conductive semiconductor layer 117 being farthest from a light emitting surface and the buffer layer 111 being closest to the light emitting surface. As used herein, top or upper indicates closer to the light emitting surface and bottom or lower indicates farther from the light emitting surface of the light emitting device package 100, here the protective layer 167.

The first and second insulating layers 131 and 132 may cover lateral surfaces of the three light emitting cells C1, C2, and C3, e.g., along the third direction D3. The reflective layer 124 may cover the lateral surfaces of the three light emitting cells C1, C2, and C3, in addition to the first and second insulating layers 131 and 132, and be on the second insulating layer 132. In other words, the first insulating layer 131, the second insulating layer 132, and the reflective layer 124 may be sequentially stacked in that order on the lateral surfaces of the three light emitting cells C1, C2, and C3. e.g., along a second direction D2 from the lateral surface of the light emitting cells. Portions of the first and second insulating layers 131 and 132 may protrude above, e.g., may extend farther in the third direction D3, the second surface of the light emitting structure LS. A portion of the reflective layer 124 may also protrude above, e.g., may extend farther in the direction D3, the second surface of the light emitting structure LS.

The active layer 115 of the first to third light emitting cells C1 to C3 may emit substantially the same light. For example, the active layer 115 may emit blue light, e.g., light having a wavelength of 440 nm to 460 nm.

The light emitting device package 100 may include the first electrodes 121 provided in the first to third light emitting cells C1 to C3, respectively, connected to the first conductivity-type semiconductor layer 113, and the second electrodes 122 provided in the first to third light emitting cells C1 to C3, respectively, connected to the second conductivity-type semiconductor layer 117. For example, the first electrodes 121 may be on the first conductivity-type semiconductor layer 113, e.g., a bottom surface of the first conductivity-type semiconductor layer 113, exposed by a mesa etching process along edges or a periphery of the first to third light emitting cells C1 to C3, respectively, and may include a region that is wider than other regions. The second electrodes 122 may be on the second conductivity-type semiconductor layer 117, e.g., on a bottom surface of the second conductivity-type semiconductor layer 117, and may include a region that is narrower than other regions corresponding to the first electrodes 121 (see FIG. 4).

For example, as may be seen in FIG. 4, the first and second electrodes 121 and 122 may extend in parallel along the first direction D1. The second electrode 122 may be wider along the second direction D2 than the first electrode 121 and may have an indent therein in the second direction D2, e.g., at a center along the first direction D1 in a side facing the first electrode 121 for that cell, and the first electrode 121 may have a protrusion extending along of the second direction into the indent of the second electrode 122, while remaining insulated therefrom. Additionally, as shown in FIG. 5, the reflective layer 124, which is connected to the second electrode 122, may have holes therein corresponding to the indents in the second electrode 122, so that the reflective layer 124 is not connected to the first electrode 121. The shapes of the first and second electrodes 121 and 122 are not limited to those illustrated in the drawings, and may be modified in various manners.

The first insulating layer 131 may cover the first to third light emitting cells C to C3. The first and second electrodes 121 and 122 may be connected to the first and second conductivity-type semiconductor layers 113 and 117 through regions from which portions of the first insulating layer 131 have been removed.

The light emitting device package 100 may include the first insulating layer 131, and the second insulating layer 132 covering the first and second electrodes 121 and 122.

The light emitting device package 100 may include the reflective layer 124, commonly connected to the second conductivity-type semiconductor layer 117 of the first to third light emitting cells C1 to C3. The reflective layer 124 may be commonly connected to the first to third light emitting cells C1 to C3 by being commonly connected to the second electrodes 122 of the first to third light emitting cells C1 to C3. Therefore, the reflective layer 124 may be referred to as a common electrode. The reflective layer 124 may cover the first to third light emitting cells C1 to C3, may be formed in integral fashion, and may include regions from which portions thereof have been removed in positions corresponding to the first electrodes 121 of the first to third light emitting cells C1 to C3. The shape of the reflective layer 124 is not limited to that illustrated in the drawings, and may be modified in various manners.

The reflective layer 124 may be connected to the second electrodes 122 of the first to third light emitting cells C1 to C3 through regions from which portions of the first insulating layer 131 and the second insulating layer 132, covering the first and second electrodes 121 and 122, have been removed. In particular, a top surface of the reflective layer 124 may be connected to the second electrodes 122.

The light emitting device package 100 may include a third insulating layer 133 covering the reflective layer 124, e.g., on a bottom surface of the reflective layer 124. The light emitting device package 100 may include the first base pad 126a connected to the first electrode 121 of the first light emitting cell C1, the second base pad 126b connected to the first electrode 121 of the second light emitting cell C2, the third base pad 126c connected to the first electrode 121 of the third light emitting cell C3, and the fourth base pad 126d connected to the reflective layer 124. The fourth base pad 126d may be referred to as a common base pad.

The first to third base pads 126a to 126c may be connected to the first electrodes 121 through regions from which portions of the second and third insulating layers 132 and 133 have been removed, and the fourth base pad 126d may be connected to the reflective layer 124 through an opening portion, from which a portion of the third insulating layer 133 has been removed. The shapes and areas of the first to fourth base pads 126a to 126d may be different from one another, as shown in FIG. 6. The shapes and areas of the first to fourth base pads 126a to 126d are not limited to those illustrated in the drawings, and may be modified in consideration of dispositions of the first to fourth electrode pads 128a to 128d.

The light emitting device package 100 may include the fourth insulating layer 134, covering the first to fourth base pads 126a to 126d. The light emitting device package 100 may include the first electrode pad 128a connected to the first base pad 126a, the second electrode pad 128b connected to the second base pad 126b, the third electrode pad 128c connected to the third base pad 126c, and the fourth electrode pad 128d connected to the fourth base pad 126d. The fourth electrode pad 128d may be referred to as a common electrode pad.

The first to fourth electrode pads 128a to 128d may be connected to the first to fourth base pads 126a to 126d through regions from which portions of the fourth insulating layer 134 have been removed. The first to fourth base pads 126a to 126d and the first to fourth electrode pads 128a to 128d may be on the first surface of the light emitting structure LS. The first to fourth electrode pads 128a to 128d may be adjacent to vertices of the first surface of the light emitting structure LS (refer to FIG. 2). The first light emitting cell C1 may have the first and second electrode pads 128a and 128b disposed therebelow, and the third light emitting cell C3 may have the third and fourth electrode pad 128c and 128d disposed therebelow.

The light emitting device package 100 may include the first and second light adjusting portions 140a and 140b provided on the second surface of the light emitting structure LS, e.g., the top surface of the buffer layer 111, to adjust light emitted by the first and second light emitting cells C1 and C2. The first light adjusting portion 140a may be in a first recess portion R1, e.g., the first light adjusting portion 140a may completely fill the first recess portion R1 in the buffer layer 111 of the first light emitting cell C1, and may include a first wavelength conversion layer 141a, a first distributed Bragg reflector (DBR) layer 143a, and a first light filter layer 145a. The second light adjusting portion 140b may be in a second recess portion R2, e.g., the second light adjusting portion 140b may completely fill the second recess portion R2 in the buffer layer 111 of the second light emitting cell C2, and may include a second wavelength conversion layer 141b, a second DBR layer 143b, and a second light filter layer 145b.

The first wavelength conversion layer 141a may be disposed in the first recess portion R1, and the second wavelength conversion layer 141b may be disposed in the second recess portion R2. Herein, portions of the buffer layer 111 remain in the first and second light emitting cells C1 and C2, e.g., surround the first and second wavelength conversion layers 141a and 141b.

The thickness of first wavelength conversion layer 141a may be the same as the depth of the first recess portion R1 and the thickness of the second wavelength conversion layer 141b may be the same as the depth of the second recess portion R2. For example, an upper surface of the first wavelength conversion layer 141a and an upper surface of the second wavelength conversion layer 141b may be coplanar with the second surface of the light emitting structure LS. Thus, a thickness of the light emitting device package 100 may be reduced.

The first and second recess portions R1 and R2 may be formed by removing portions of the buffer layer 111. The buffer layer 111 may include an undoped GaN layer. The depths of the first and second recess portions R1 and R2 may be illustrated as being the same as the thickness of the buffer layer 111, but embodiments are not limited thereto. The depths of the first and second recess portions R1 and R2 may be variously modified within a range of 1 nm to 10 μm.

The first and second wavelength conversion layers 141a and 141b may include wavelength conversion materials, such as a phosphor or quantum dots (QDs). In this example embodiment, the first wavelength conversion layer 141a may include red QDs, and the second wavelength conversion layer 141b may include green QDs.

The first and second DBR layers 143a and 143b may be disposed on the first and second wavelength conversion layers 141a and 141b, respectively, and may reflect blue light emitted by the first and second light emitting cells C1 and C2. This may allow for reuse of the blue light emitted by the first and second light emitting cells C1 and C2, thus improving light conversion efficiency of the red QDs and the green QDs included in the first and second wavelength conversion layers 141a and 141b.

The first and second light filter layers 145a and 145b may be disposed on the first and second DBR layers 143a and 143b, respectively, and may selectively block the blue light emitted by the first and second light emitting cells C1 and C2. The first light filter layer 145a may selectively transmit red light emitted by the first wavelength conversion layer 141a. The second light filter layer 145b may selectively transmit green light emitted by the second wavelength conversion layer 141b.

The first insulating layer 131, the second insulating layer 132, and the reflective layer 124 may optically isolate the first to third light emitting cells C1 to C3 from one another, and may optically isolate the first and second wavelength conversion layers 141a and 141b from each other. When the light emitting device package 100 is applied to a pixel of a display panel, the first light emitting cell C1 and the first light adjusting portion 140a may form a first subpixel, the second light emitting cell C2 and the second light adjusting portion 140b may form a second subpixel, and the third light emitting cell C3 may form a third subpixel. Mixing of colors between the first to third subpixels may be prevented.

Further, the first and second wavelength conversion layers 141a and 141b may be respectively protected by the first and second light emitting cells C1 and C2 and the first and second DBR layers 143a and 143b, thus improving reliability of the red and green QDs included in the first and second wavelength conversion layers 141a and 141b.

FIGS. 7 through 15 are cross-sectional views illustrating a method of manufacturing the light emitting device package 100 of FIGS. 1 through 3. In detail, the method of manufacturing the light emitting device package 100 relates to a method of manufacturing a wafer-level, chip-scale package. Hereinafter, process drawings illustrate enlarged cross-sectional views of a single light emitting device package for easier understanding. FIGS. 7 through 15 illustrate cross-sectional views taken along line I-I' of FIG. 1.

Figure 7:
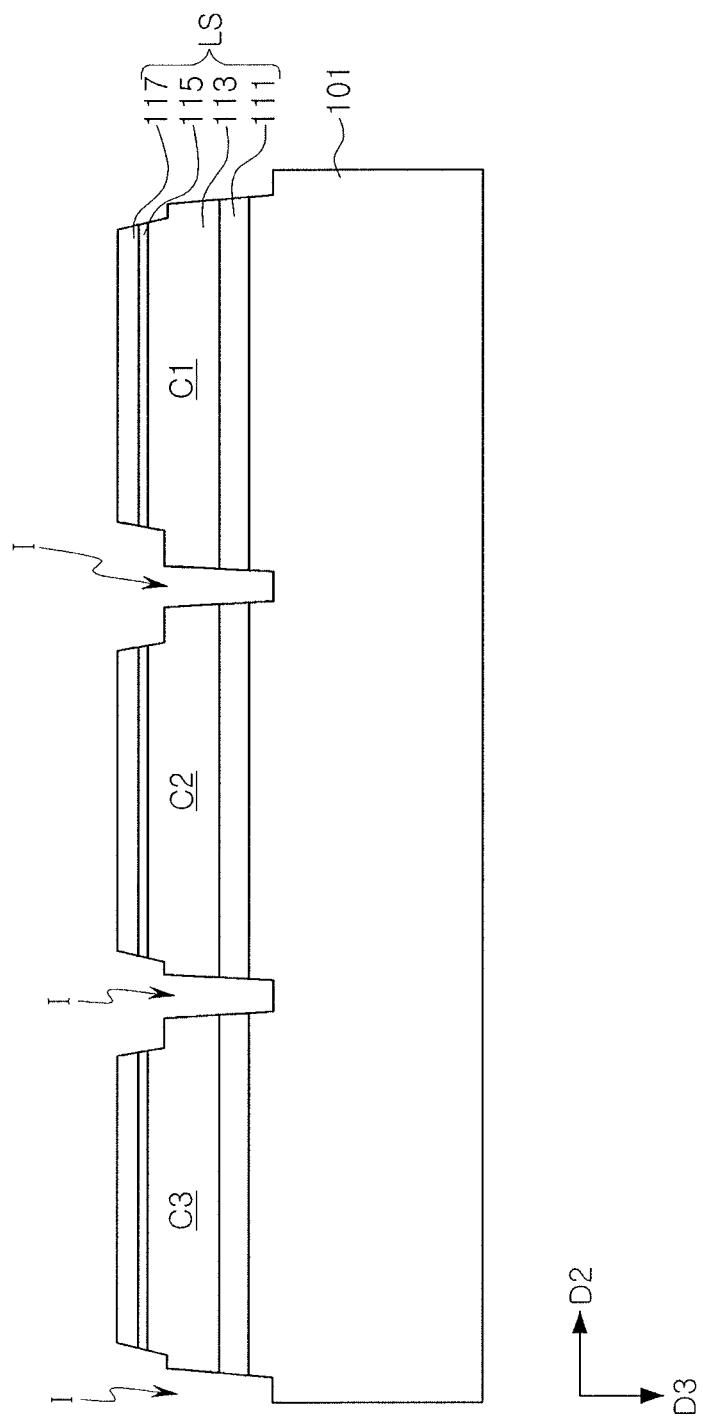
FIGS. 7 through 15 illustrate cross-sectional views of stages in a method of manufacturing a light emitting device package according to an example embodiment.

Referring to FIG. 7, the method of manufacturing the light emitting device package 100 may begin with providing, on a substrate 101, the light emitting structure LS, including the buffer layer 111, the first conductivity-type semiconductor layer 113, the active layer 115, and the second conductivity-type semiconductor layer 117.

The substrate 101 may be an insulating, conductive, or semiconductor substrate, as desired. For example, the substrate 101 may include sapphire, SiC, silicon (Si), $MgAl_2O_4$, MgO, $LiAlO_2$, $LiGaO_2$, or GaN.

The light emitting structure LS may include epitaxial layers of a group III nitride-based semiconductor layer grown on the substrate 101. The buffer layer 111 may include a composition of $In_xAl_yGa_{1-x-y}N$ ($0 \leq x \leq 1$, $0 \leq y \leq 1$). For example, the buffer layer 111 may include GaN, AlN, AlGaN, and InGaN, which are not doped with n- or p-type impurity. If necessary, the buffer layer 111 may be formed by combining a plurality of layers having different compositions, or may be formed of a single layer whose composition is gradually changed. The first conductivity-type semiconductor layer 113 may be a nitride semiconductor layer, having a composition of n-type $In_xAl_yGa_{1-x-y}N$ ($0 \leq x < 1$, $0 \leq y < 1$, $0 \leq x+y < 1$), and an n-type impurity may include silicon (Si), germanium (Ge), selenium (Se), tellurium (Te), or the like. The active layer 115 may have a multiple quantum well (MQW) structure in which quantum well layers and quantum barrier layers are alternately layered on each other. For example, the quantum well layers and the quantum barrier layers may include different compositions of $In_xAl_yGa_{1-x-y}N$ ($0 \leq x \leq 1$, $0 \leq y \leq 1$, $0 \leq x+y \leq 1$). In an example embodiment, the quantum well layers may include a composition of $In_xGa_{1-x}N$ ($0 < x \leq 1$), and the quantum barrier layers may include GaN or AlGaN. The second conductivity-type semiconductor layer 117 may be a nitride semiconductor layer having a composition of p-type $In_xAl_yGa_{1-x-y}N$ ($0 \leq x < 1$, $0 \leq y < 1$, $0 \leq x+y < 1$), and a p-type impurity may include magnesium (Mg), zinc (Zn), beryllium (Be), or the like.

Next, a mesa etching process may be performed, such that a portion of the first conductivity-type semiconductor layer 113 may be exposed by removing portions of the second conductivity-type semiconductor layer 117 and the active layer 115. Subsequently, an isolation process of dividing the light emitting structure LS into various light emitting cells C1, C2, and C3 may be performed. For example, the isolation process may form an isolation region I by cutting the light emitting structure LS, using a blade, but embodiments are not limited thereto.

The light emitting cells C1, C2, and C3 obtained by the isolation process may have trapezoidal shapes whose upper or top portions are narrower than lower or bottom portions thereof, e.g., along the second direction D2 and the first direction D1, which may allow the light emitting cells C1, C2, and C3 to have inclined lateral surfaces, with respect to an upper surface of the substrate 101. The isolation region I may be a recess portion formed through the removal of a portion of the substrate 101.

Figure 8:
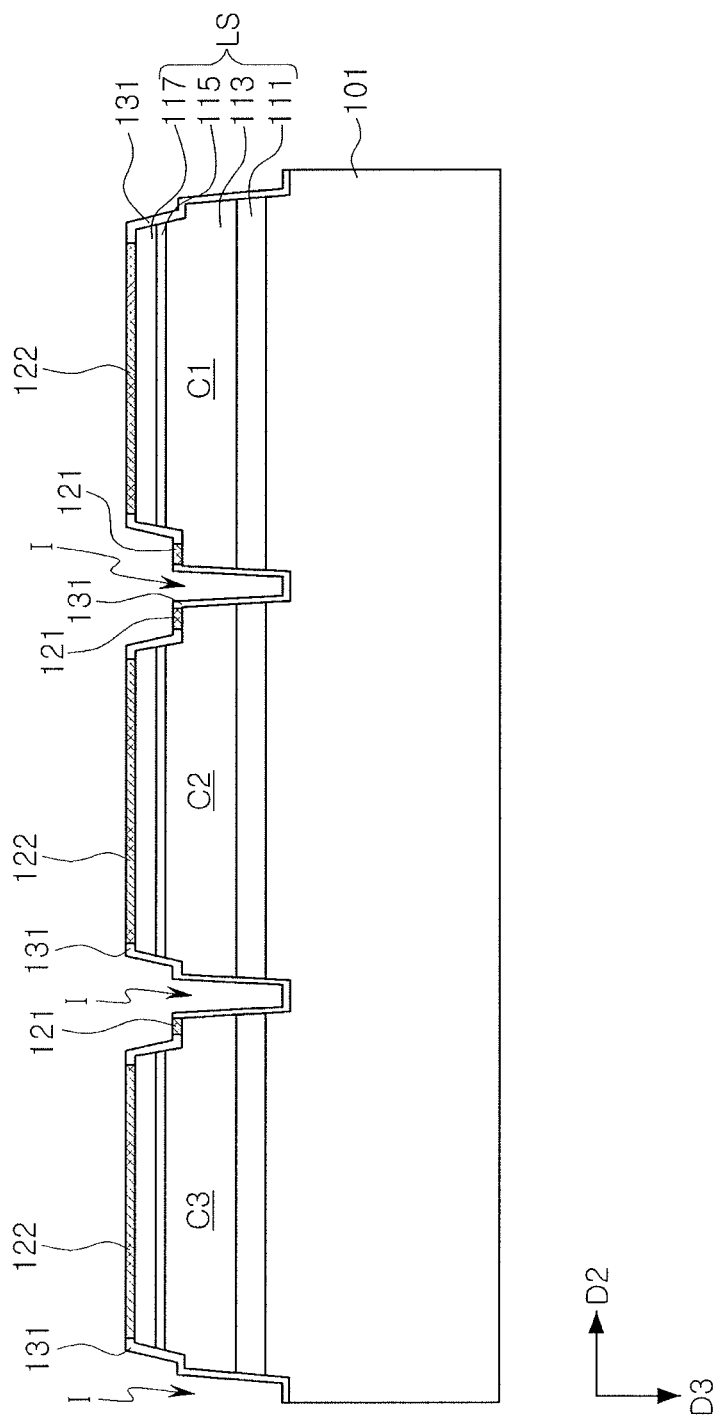

Referring to FIG. 8, portions of the first insulating layer 131 may be removed, and the first and second electrodes 121 and 122, formed of conductive materials, may then be formed in the removed portions of the first insulating layer 131.

First, the first insulating layer 131, covering the first to third light emitting cells C1 to C3, may be formed. The first insulating layer 131 may be formed on the substrate 101 in the isolation region I. The first insulating layer 131 may include, e.g., a silicon oxide, a silicon oxynitride, or a silicon nitride.

Subsequently, the portions of the first insulating layer 131 may be removed, and the first electrode 121, contacting the first conductivity-type semiconductor layer 113, and the second electrode 122, contacting the second conductivity-type semiconductor layer 117, may then be formed in the removed portions of the first insulating layer 131. The first and second electrodes may be coplanar with the first insulating layer. The first and second electrodes 121 and 122 may include different conductive materials, and may be formed through separate processes.

The first and second electrodes 121 and 122 may be reflective electrodes, each including at least one of silver (Ag), aluminum (Al), nickel (Ni), titanium (Ti), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn), or alloys thereof.

Figure 9:
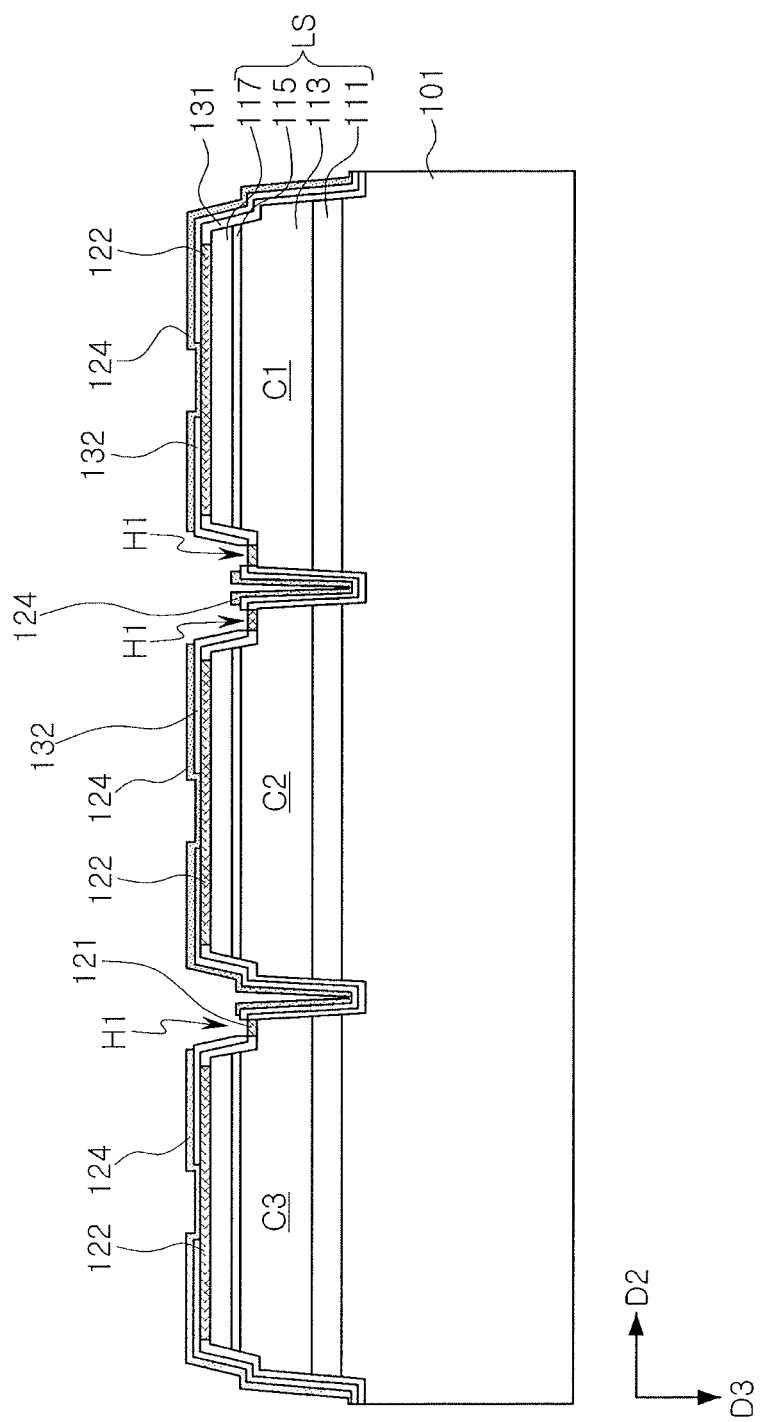

Referring to FIG. 9, the second insulating layer 132 may be formed on the first insulating layer 131 to cover the first to third light emitting cells C1 to C3, and the reflective layer 124 may be formed on the second insulating layer 132. The second insulating layer 132 may have a first hole H1, exposing a portion of the first electrode 121, and a second hole H2, exposing a portion of the second electrode 122. The second insulating layer 132 may include, for example, a silicon oxide, a silicon oxynitride, or a silicon nitride.

The reflective layer 124 may be connected to the second electrode 122 through the second hole H2. The reflective layer 124 may cover the first to third light emitting cells C1 to C3, may be formed in integral fashion, and may include regions from which portions thereof have been removed in positions corresponding to the first electrodes 121 of the first to third light emitting cells C1 to C3. The second insulating layer 132 and the reflective layer 124 may cover the first insulating layer 131 in the isolation region I between the first to third light emitting cells C1 to C3. The reflective layer 124 may be a reflective electrode including at least one of silver (Ag), aluminum (Al), nickel (Ni), titanium (Ti), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn), or alloys thereof.

Figure 10:
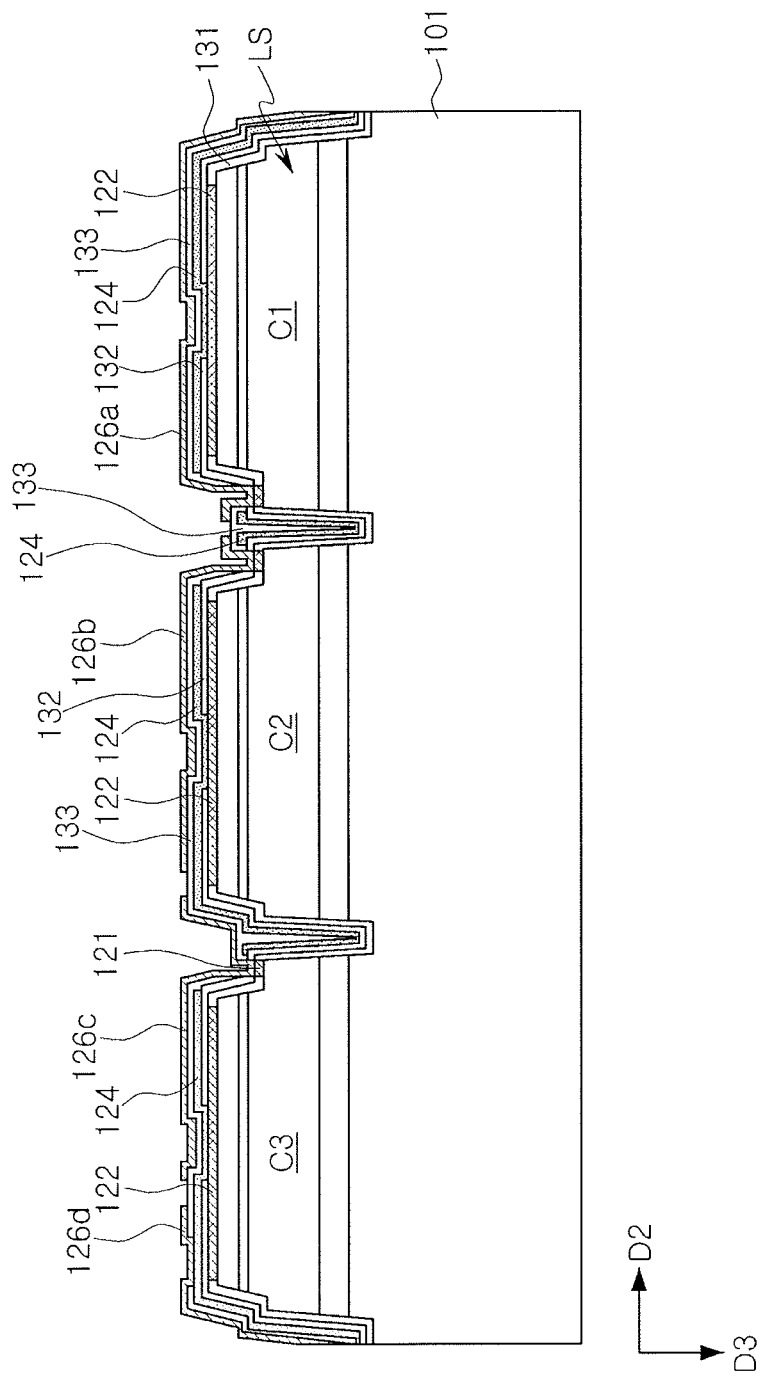

Referring to FIG. 10, the third insulating layer 133 may be formed, and the first to fourth base pads 126a to 126d may be formed.

First, the third insulating layer 133 covering the reflective layer 124 may be formed. A portion of the third insulating layer 133 may be removed to expose a portion of the first electrode 121. A portion of the third insulating layer 133 may also be removed to expose a portion of the reflective layer 124. The third insulating layer 133 may include, for example, a silicon oxide, a silicon oxynitride, or a silicon nitride.

Subsequently, the first to fourth base pads 126a to 126d may be formed on the third insulating layer 133 by a deposition process or a plating process. The shapes and areas of the first to fourth base pads 126a to 126d may be different from one another (refer to FIG. 6). The first to fourth base pads 126a to 126d may include at least one of silver (Ag), aluminum (Al), nickel (Ni), titanium (Ti), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn), or alloys thereof.

Figure 11:
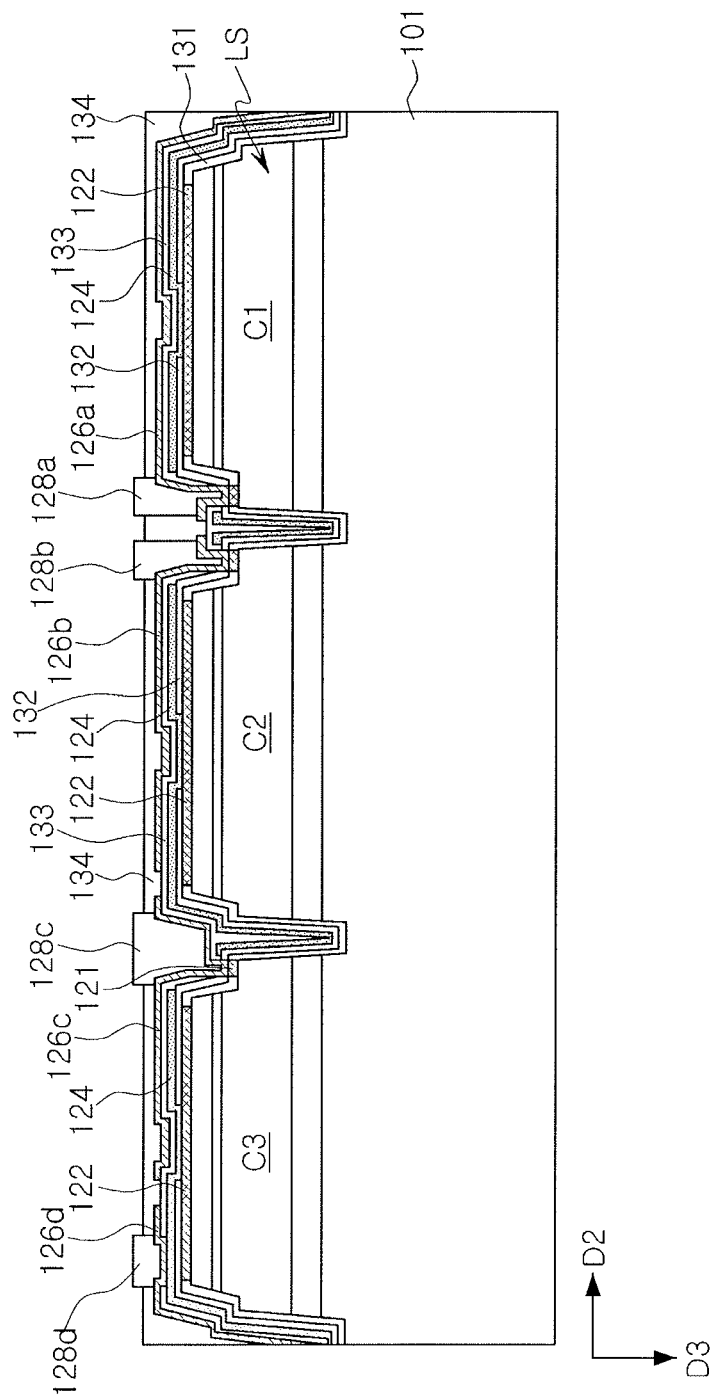

Referring to FIG. 11, the fourth insulating layer 134 may be formed, and the first to fourth electrode pads 128a to 128d may be formed.

The fourth insulating layer 134 covering the first to fourth base pads 126a to 126d may be formed. Portions of the fourth insulating layer 134 may be removed to correspond to regions in which the first to fourth electrode pads 128a to 128d have been formed. The first to fourth base pads 126a to 126d may be exposed to the removed portions of the fourth insulating layer 134.

The first to fourth electrode pads 128a to 128d may be formed using a plating process, to be connected to the first to fourth base pads 126a to 126d, respectively. The first to fourth electrode pads 128a to 128d may be formed of, but are not limited to, copper (Cu), and may be formed of a conductive material other than copper (Cu).

Figure 12:
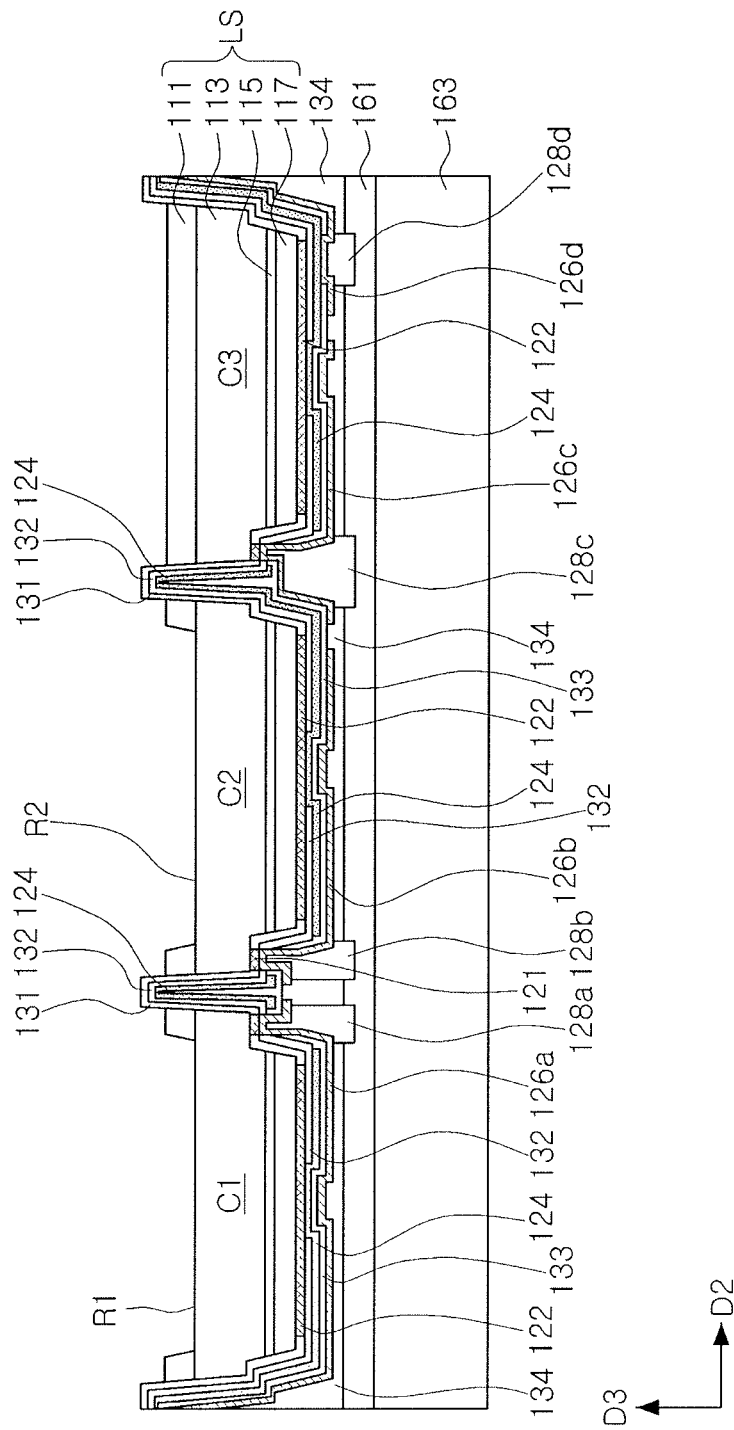

Referring to FIG. 12, the substrate 101 may be removed to expose the buffer layer 111 and the first insulating layer 131. The first recess portion R1 may be formed in the first light emitting cell C1 and the second recess portion R2 may be formed in the second light emitting cell C2, e.g., in corresponding buffer layer 11 thereof.

A support substrate 163 may be attached to the first to fourth electrode pads 128a to 128d. A bonding layer 161, e.g., an ultraviolet curable film or a wax material, may be used to attach the support substrate 163 to the first to fourth electrode pads 128a to 128d. When the substrate 101 is an opaque substrate, e.g., a silicon (Si) substrate, the substrate 101 may be removed by grinding, polishing, dry etching, or a combination thereof. Alternatively, when the substrate 101 is a transparent substrate, such as a sapphire substrate, the substrate 101 may be separated from the first to third light emitting cells C1 to C3 through a laser lift-off (LLO) process. A laser used in the LLO process may be at least one of a 193 nm excimer laser, a 248 nm excimer laser, a 308 nm excimer laser, a neodymium-doped yttrium aluminum garnet (Nd:YAG) laser, a helium (He)-neon (Ne) laser, and an argon (Ar) ion laser.

After the substrate 101 is removed, portions of the first insulating layer 131, the second insulating layer 132 and the reflective layer 124 may protrude above the light emitting structure LS. The first recess portion R1 may be formed by removing a portion of the buffer layer 111 of the first light emitting cell C1, e.g., using an etching process, and the second recess portion R2 may be formed by removing a portion of the buffer layer 111 of the second light emitting cell C2, e.g., using an etching process.

Figure 13:
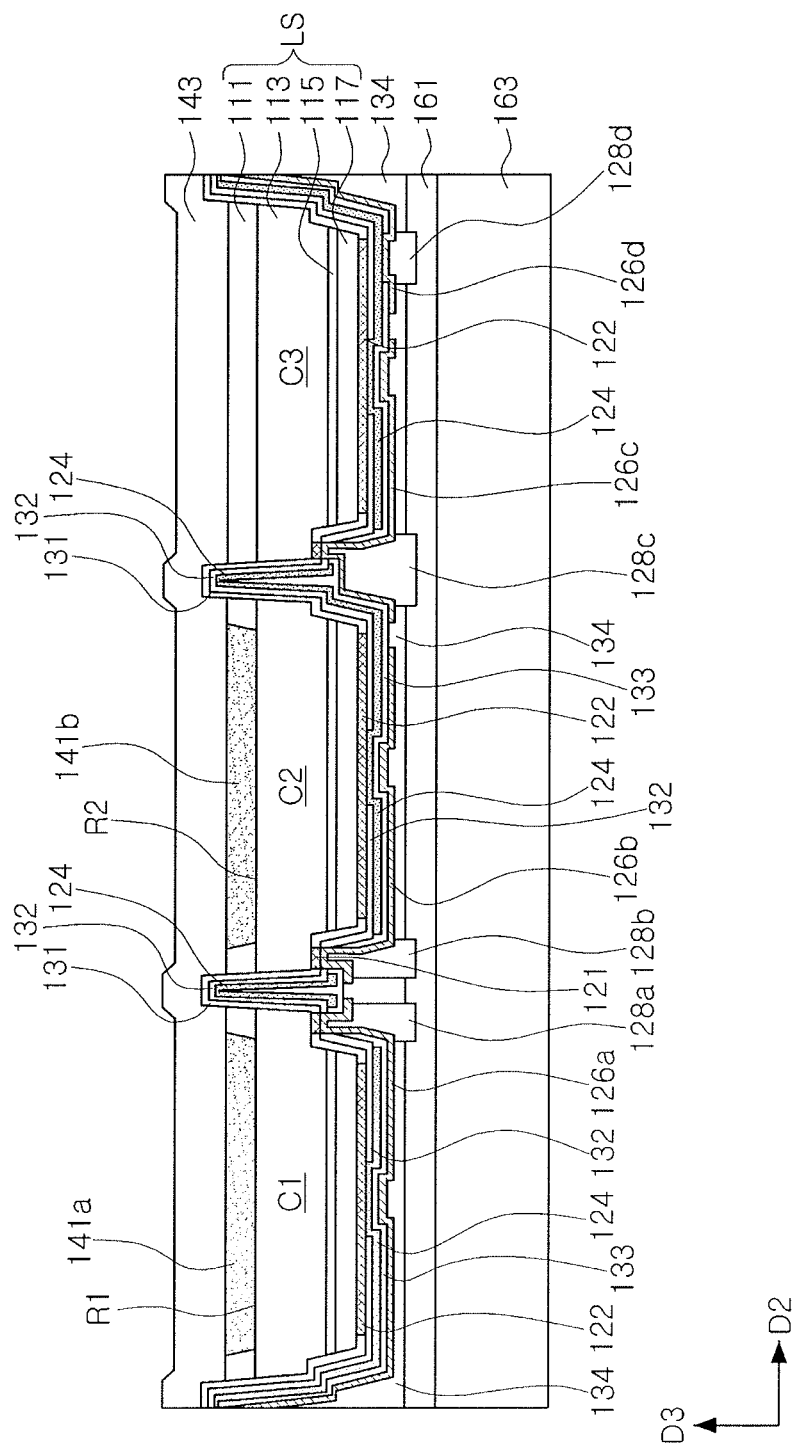

Referring to FIG. 13, the first and second wavelength conversion layers 141a and 141b may be formed in the first and second recess portions R1 and R2, respectively. The first and second wavelength conversion layers 141a and 141b, and a DBR layer 143 covering the buffer layer 111, may be formed.

The first and second wavelength conversion layers 141a and 141b may include various types of wavelength conversion material, such as a phosphor or QDs. For example, the first wavelength conversion layer 141a may include red QDs, and the second wavelength conversion layer 141b may include green QDs. The first and second wavelength conversion layers 141a and 141b may be formed in the first and second recess portions R1 and R2, respectively, using an inkjet process. Alternatively, the first and second wavelength conversion layers 141a and 141b may be formed using a coating process or a photolithography process.

The DBR layer 143 may have a structure in which the first insulating layer 131, having a first refractive index, and the second insulating layer 132, having a second refractive index, are alternately stacked; the first and second insulating layers 131 and 132 may be stacked repeatedly 2 to 100 times. The first and second refractive indexes may be different from each other. For example, the second refractive index may be greater than the first refractive index. Each of the first and second insulating layers 131 and 132 may include oxide or nitride, such as $SiO_2$, SiN, $SiO_xN_y$, $TiO_2$, $Si_3N_4$, $Al_2O_3$, $ZrO_2$, $HfO_2$, TiN, AlN, TiAlN, or TiSiN. The DBR layer 143 may reflect blue light emitted by the first and second light emitting cells C1 and C2. In an example embodiment, the DBR layer 143 may have a structure in which an organic layer having a first refractive index and an inorganic layer having a second refractive index, greater than the first refractive index, are alternately stacked.

Figure 14:
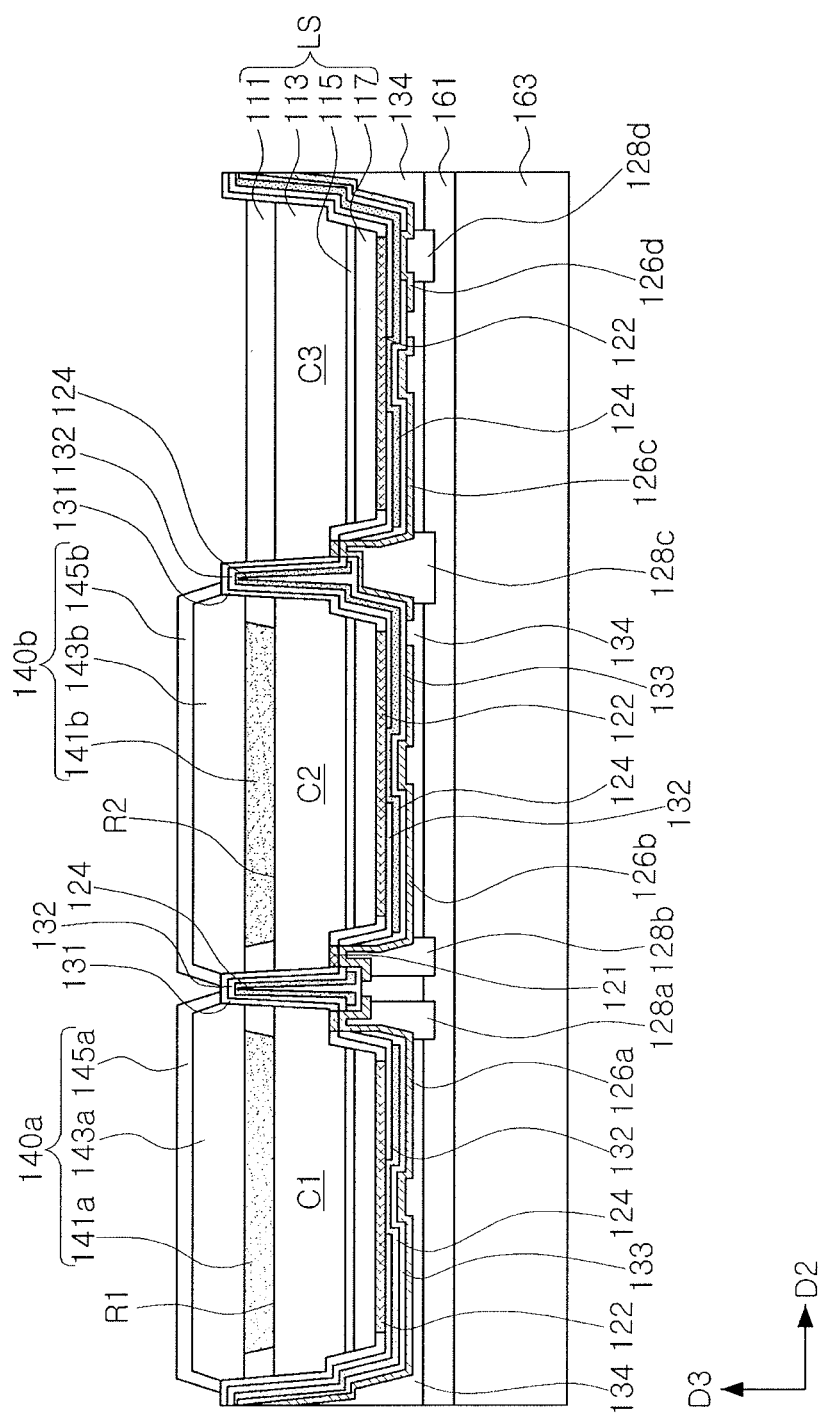

Referring to FIG. 14, the DBR layer 143 may be removed, e.g., etched, to form the first DBR layer 143*a* and the second DBR layer 143*b*, separated from each other. The first light filter layer 145*a*, covering the first DBR layer 143*a*, may be formed, and the second light filter layer 145*b*, covering the second DBR layer 143*b*, may be formed.

The upper surface of the first DBR layer 143*a* and the upper surface of the second DBR layer 143*b* may be higher, e.g., along the third direction D3, than the distal or upper end of the first insulating layer 131. The first and second light filter layers 145*a* and 145*b* may be in contact with the first insulating layer 131. In some cases, when portions of the first and second insulating layers 131 and 132 are etched by the etching process of the DBR layer 143, the first and second light filter layers 145*a* and 145*b* may be in contact with the reflective layer 124.

The first wavelength conversion layer 141*a*, the first DBR layer 143*a*, and the first light filter layer 145*a* may form the first light adjusting portion 140*a*. The second wavelength conversion layer 141*b*, the second DBR layer 143*b*, the second light filter layer 145*b* may form the second light adjusting portion 140*b*.

Figure 15:
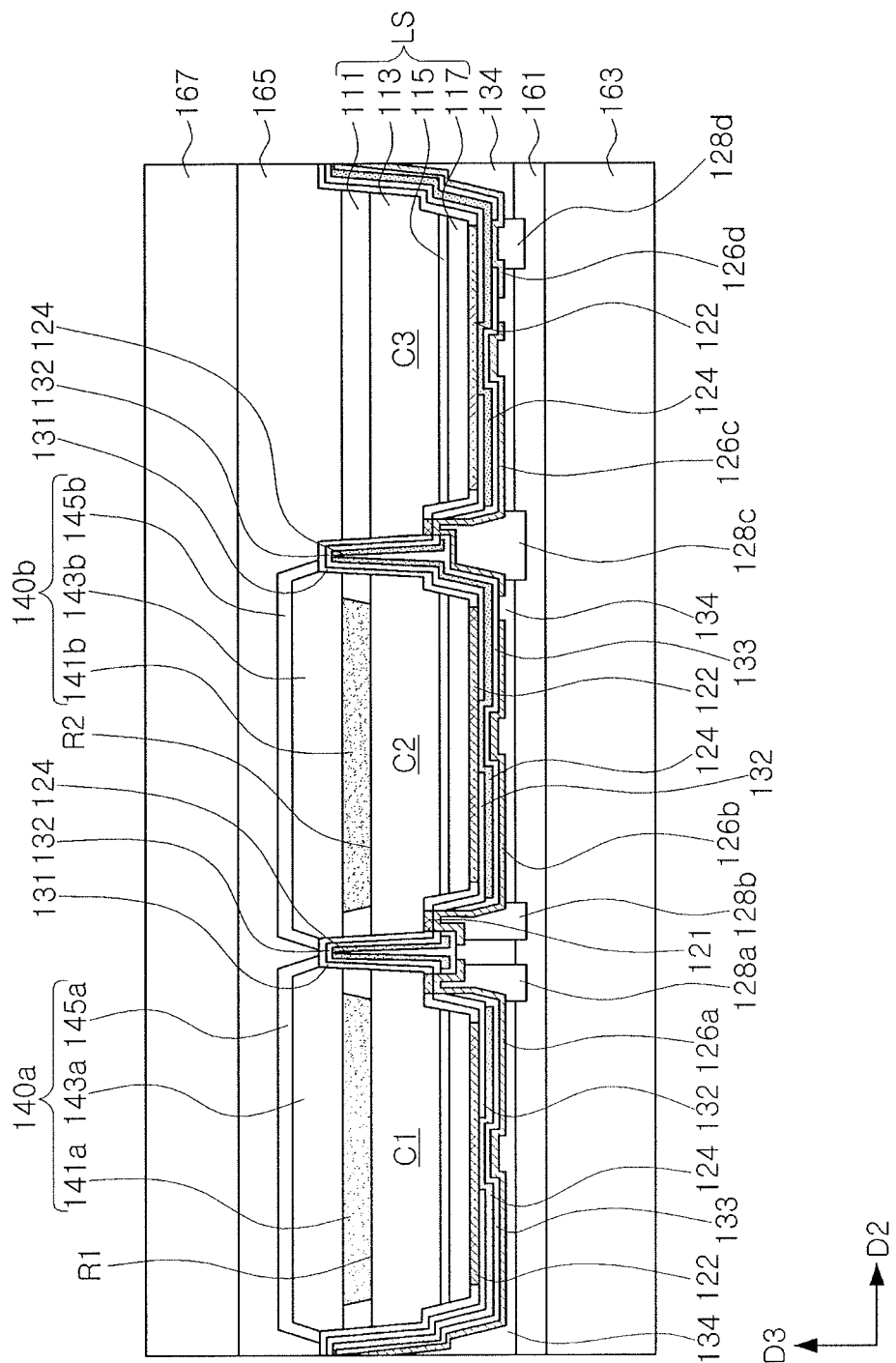

Referring to FIG. 15, a protective layer 167 may be formed on the second surface of the light emitting structure LS to cover the first and second light adjusting portions 140*a* and 140*b*. The protective layer 167 may be a support substrate which may replace a growth substrate used to grow the light emitting structure LS, and may be formed of a light transmitting material. For example, the protective layer 167 may be a glass substrate or a touch screen panel.

The protective layer 167 may be bonded using a light-transmitting bonding layer 165. For example, the light-transmitting bonding layer 165 may include polyacrylate, polyimide, polyamide, or benzocyclobutene (BCB). The bonding layer 165 may reduce the step differences of the light emitting structure LS such that planar surface is provided for the protective layer 167.

Ultimately, a process of cutting various types of light emitting device packages, formed through a wafer level process, into individual packages may be performed. The present cutting process may be performed, e.g., by removing the support substrate 163, bonding an adhesive tape, and cutting various types of light emitting device packages into individual packages, with a blade.

A light emitting device package in the form of a chip-scale package, obtained through the above-mentioned processes may have substantially the same size as a semiconductor light emitting device, for example, an LED chip. Thus, when the light emitting device package is used as a lighting device or the like, light having a high degree of intensity per unit area may be obtained, and when the light emitting device package is used in a display panel, a pixel size and a pixel pitch of the display panel may be reduced. Also, since all processes of manufacturing a wafer-level chip scale package are performed at a wafer level, the method may be suited for mass production, and may enable an optical structure, such as a wavelength conversion layer or a filter layer containing a phosphor, to be manufactured to be integrated with an LED chip.

Figure 16:
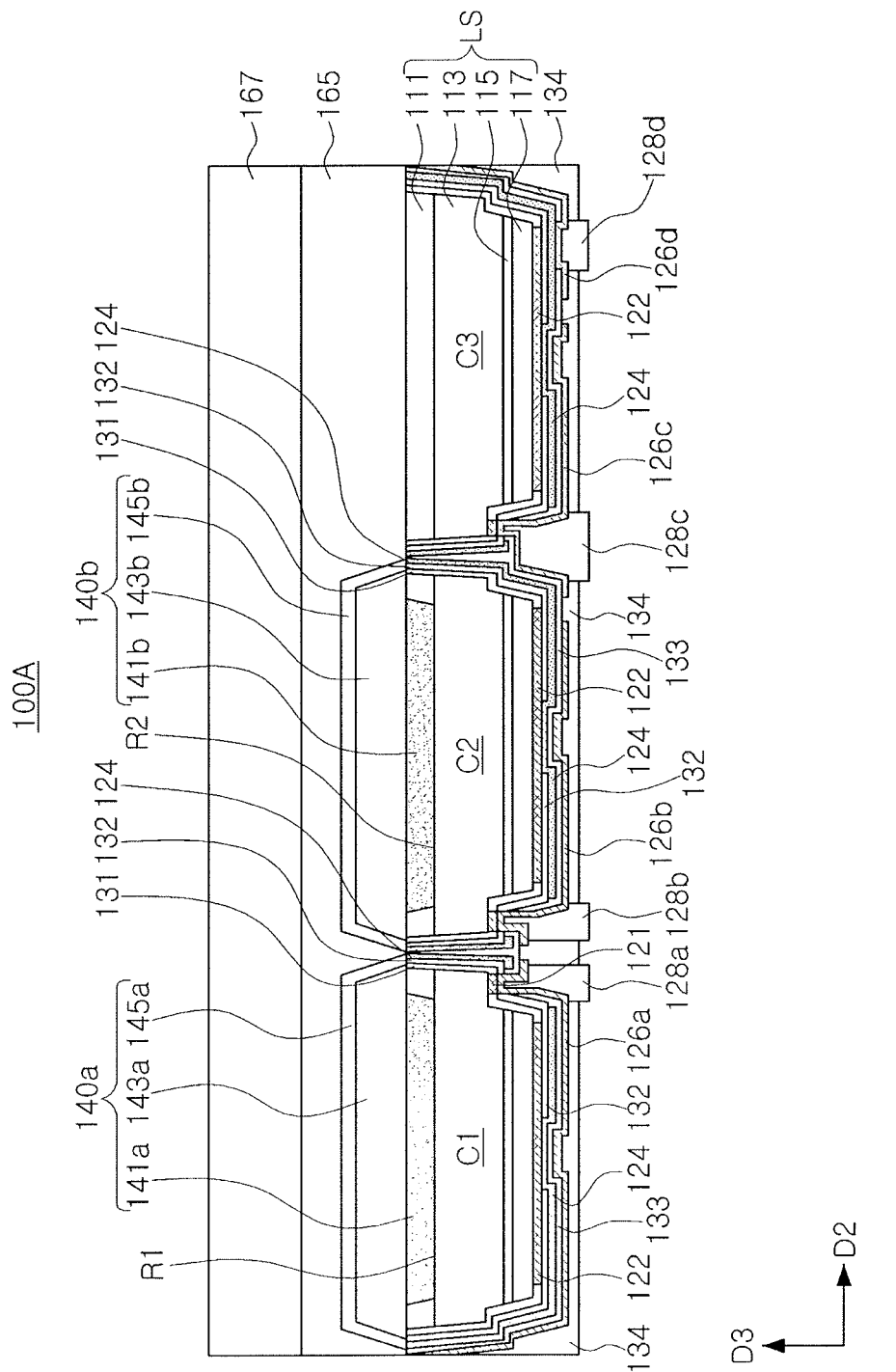
FIG. 16 illustrates a cross-sectional view of a light emitting device package according to an example embodiment.

FIG. 16 is a cross-sectional view of a light emitting device package 100A according to an example embodiment. The light emitting device package 100A illustrated in FIG. 16 may differ from the light emitting device package 100, described above with reference to FIGS. 1 through 3, in only the structure of a first insulating layer 131, a second insulating layer 132, and a reflective layer 124 disposed between first to third light emitting cells C1 to C3. The remainder of the structure of the light emitting device package 100A may be the same as the structure of the light emitting device package 100. Thus, descriptions of identical elements will be omitted, and only the difference between the structures will hereinafter be briefly described.

In the case of the light emitting device package 100A, the first insulating layer 131, the second insulating layer 132, and the reflective layer 124 may not protrude above, e.g., along the third direction D3, the second surface of a light emitting structure LS in a region between the first to third light emitting cells C1 to C3, e.g., in an isolation region. For example, an upper surface of the first insulating layer 131, an upper surface of the second insulating layer 132, and an upper surface of the reflective layer 124 may be coplanar with the second surface of the light emitting structure LS.

Figure 17:
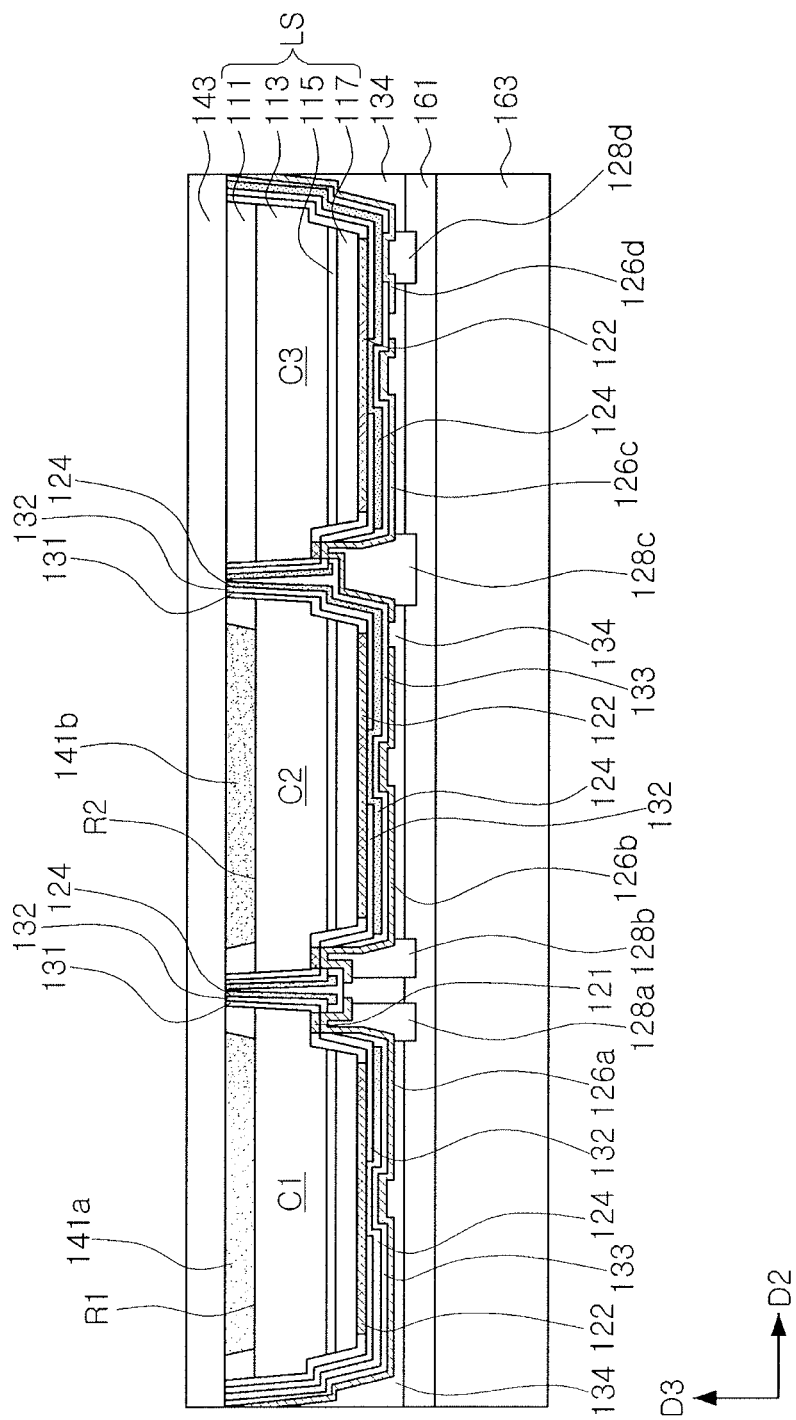
FIG. 17 illustrates a cross-sectional view of a method of manufacturing the light emitting device package illustrated in FIG. 16.

FIG. 17 is a cross-sectional view illustrating a method of manufacturing the light emitting device package 100A illustrated in FIG. 16. he processes of FIGS. 7 through 11 may be performed in the same manner as described above, and after the process of removing the substrate 101, described in relation to FIG. 12, portions of the first insulating layer 131, the second insulating layer 132, and the reflective layer 124, protruding above the second surface of the light emitting structure LS, may be removed by a planarizing process. Subsequently, the process described in relation to FIG. 13 may be performed, and the structure illustrated in FIG. 17 may be obtained. Thereafter, the processes described in relation to FIGS. 14 and 15 may be performed, and a light emitting device package may be cut into individual packages. Thus, the light emitting device package 100A of FIG. 16 may be obtained.

Figure 18:
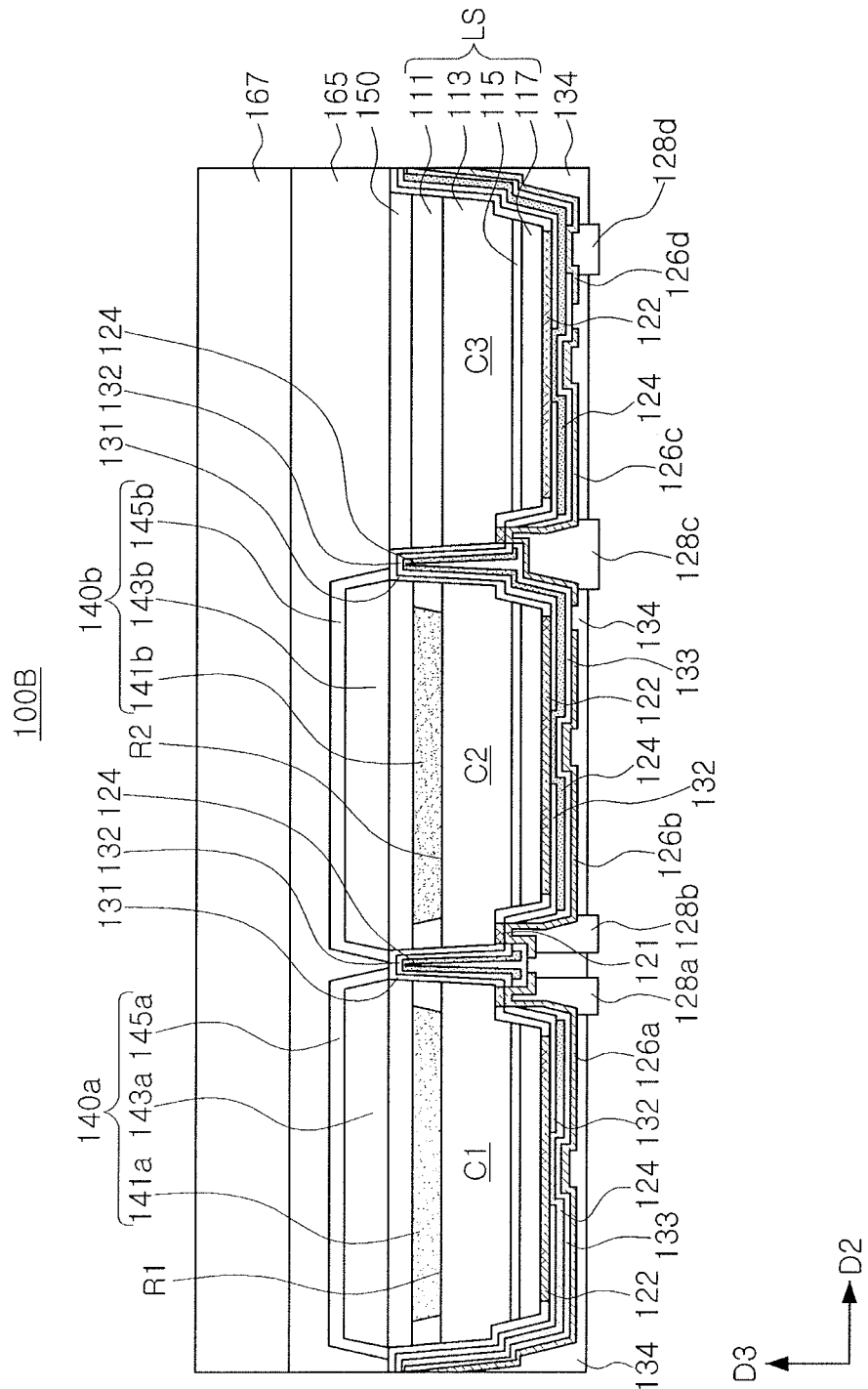
FIG. 18 illustrates a cross-sectional view of a light emitting device package according to an example embodiment.

FIG. 18 is a cross-sectional view of a light emitting device package 100B according to an example embodiment. The light emitting device package 100B illustrated in FIG. 18 may differ from the light emitting device package 100, described above with reference to FIGS. 1 through 3, in only the inclusion of a transparent organic layer 150 disposed on first to third light emitting cells C1 to C3. The remainder of the structure of the light emitting device package 100B may be the same as the structure of the light emitting device package 100. Thus, only the difference between the structures will hereinafter be briefly described.

The light emitting device package 100B may have the same thickness as the protruding height of a first insulating layer 131, with respect to a second surface of a light emitting structure LS, and may further include the transparent organic layer 150 provided on the light emitting structure LS. The transparent organic layer 150 may be in contact with first and second wavelength conversion layers 141*a* and 141*b*, and may also be in contact with a buffer layer 111 of the third light emitting cell C3. The transparent organic layer 150 may be below first and second DBR layers 143*a* and 143*b*. The transparent organic layer 150 may also be below a light-transmitting bonding layer 165, while being on the third light emitting cell C3.

Figure 19:
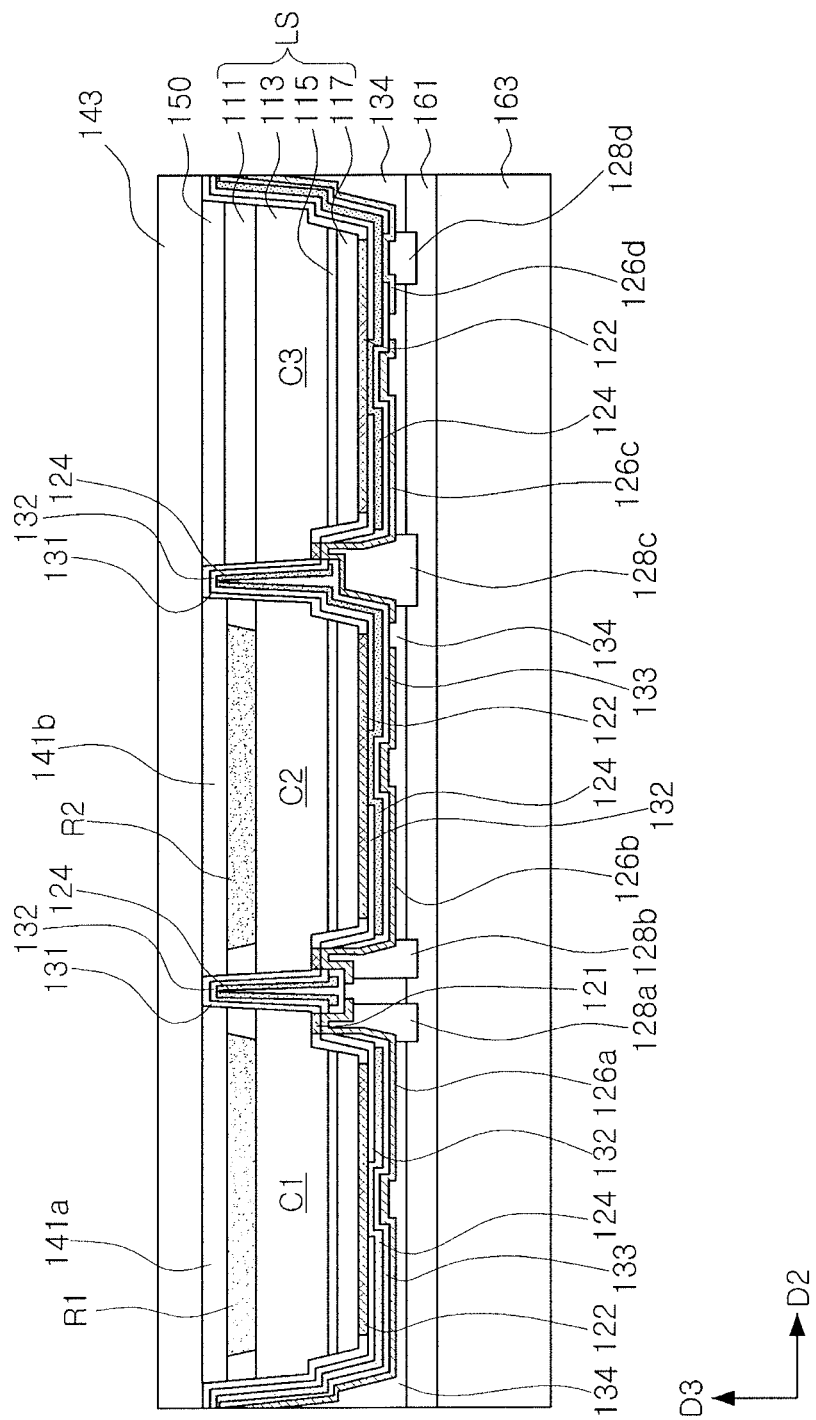
FIG. 19 illustrates a cross-sectional view a method of manufacturing the light emitting device package illustrated in FIG. 18.

FIG. 19 is a cross-sectional view illustrating a method of manufacturing the light emitting device package 100B illustrated in FIG. 18. The processes of FIGS. 7 through 12 may be performed in the same manner as described above, and the transparent organic layer 150 may be formed prior to the formation of the DBR layer 143 described in relation to FIG. 13. Thus, the structure illustrated in FIG. 19 may be obtained. Thereafter, the processes described in relation to FIGS. 14 and 15 may be performed, and a light emitting device package may be cut into individual packages. Thus, the light emitting device package 100B of FIG. 18 may be obtained.

Figure 20:
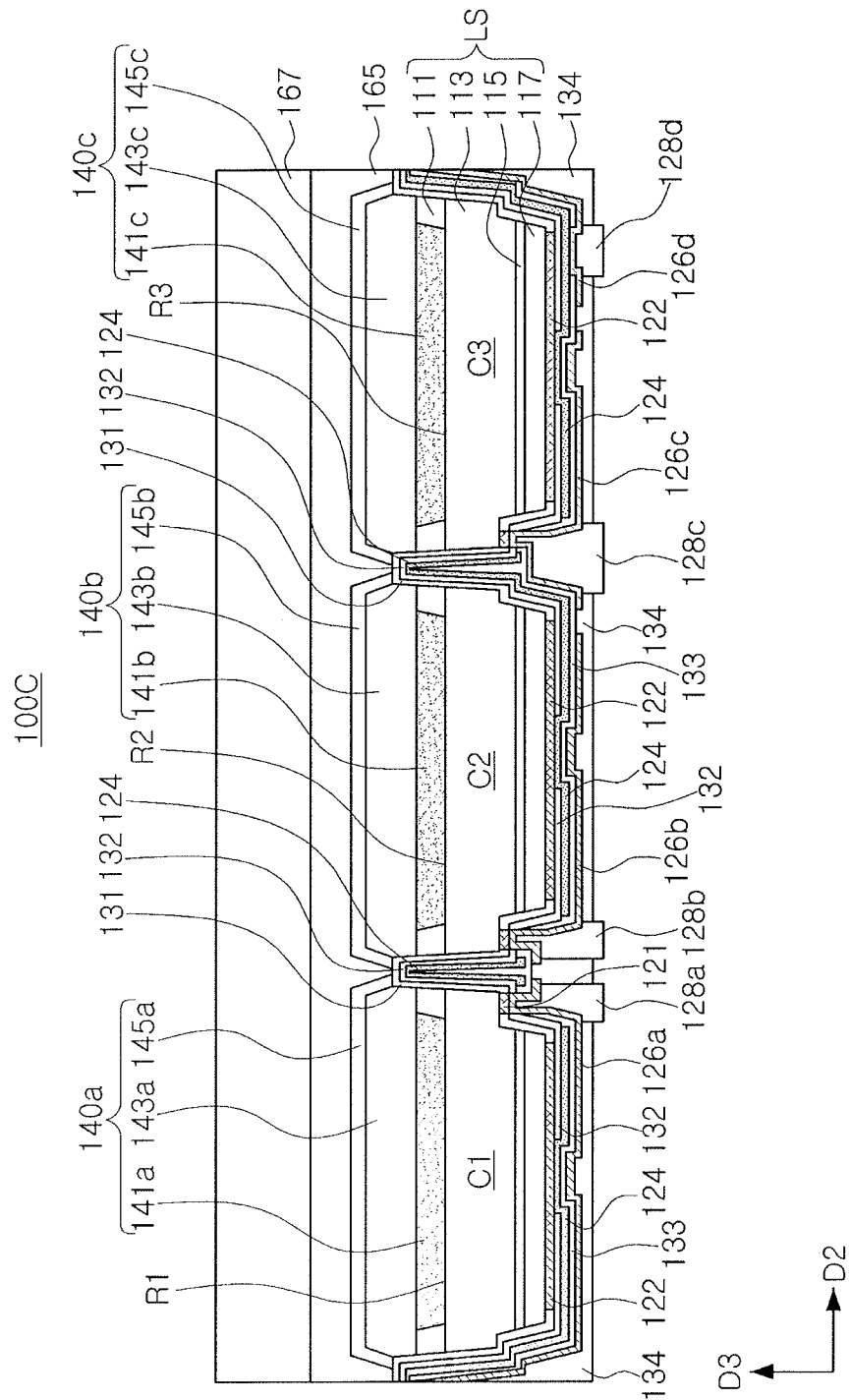
FIG. 20 illustrates a cross-sectional view of a light emitting device package according to an example embodiment.

FIG. 20 is a cross-sectional view of a light emitting device package 100C according to an example embodiment. The light emitting device package 100C illustrated in FIG. 20 may differ from the light emitting device package 100, described above with reference to FIGS. 1 through 3, in only the inclusion of a third light adjusting portion 140c' disposed on a third light emitting cell C3. The remainder of the structure of the light emitting device package 100C may be the same as the structure of the light emitting device package 100. Thus, only the difference between the structures will hereinafter be briefly described.

The light emitting device package 100C may include the third light adjusting portion 140c' disposed on a third recess portion R3 of the third light emitting cell C3, provided on a second surface of a light emitting structure LS, the third light adjusting portion 140c' being configured to provide blue light.

In the case of the light emitting device package 100C, a first light emitting cell C1, a second light emitting cell C2, and the third light emitting cell C3 may emit ultraviolet light. A first light adjusting portion 140a', a second light adjusting portion 140b', and the third light adjusting portion 140c' may include a first DBR layer 143a', a second DBR layer 143b', and a third DBR layer 143c', disposed on a first wavelength conversion layer 141a', a second wavelength conversion layer 141b', and a third wavelength conversion layer 141c', respectively, to reflect ultraviolet light. The first to third light adjusting portions 140a' to 140c' may include first to third light filter layers 145a' to 145c' disposed on the first to third DBR layers 143a' to 143c', respectively, to selectively block ultraviolet light.

Figure 21:
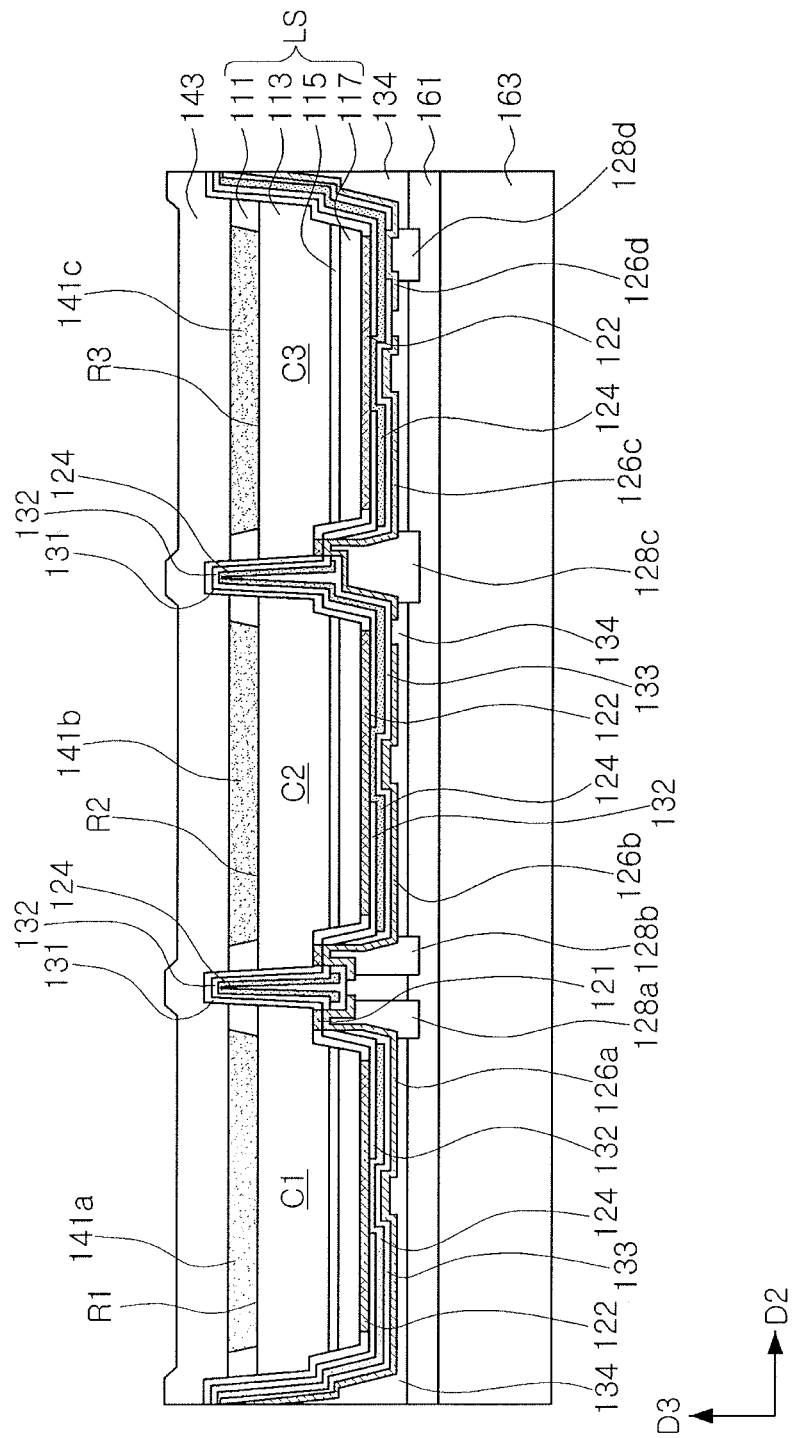
FIG. 21 illustrates a cross-sectional view of a method of manufacturing the light emitting device package illustrated in FIG. 20.

FIG. 21 is a cross-sectional view illustrating a method of manufacturing the light emitting device package 100C illustrated in FIG. 20. The processes of FIGS. 7 through 11 may be performed in the same manner as described above. Then, after performing the process of FIG. 12, the third recess portion R3 may be additionally formed on the third light emitting cell C3, e.g., in the buffer layer 111 thereof. Subsequently, when the process of FIG. 13 is performed, the third wavelength conversion layer 141c' may be additionally formed in the third recess portion R3. In this way, the structure illustrated in FIG. 21 may be obtained. Thereafter, the processes described above in relation to FIGS. 14 and 15 may be performed, and the light emitting device package may be cut into the individual packages. Thus, the light emitting device package 100C of FIG. 20 may be obtained.

Figure 22:
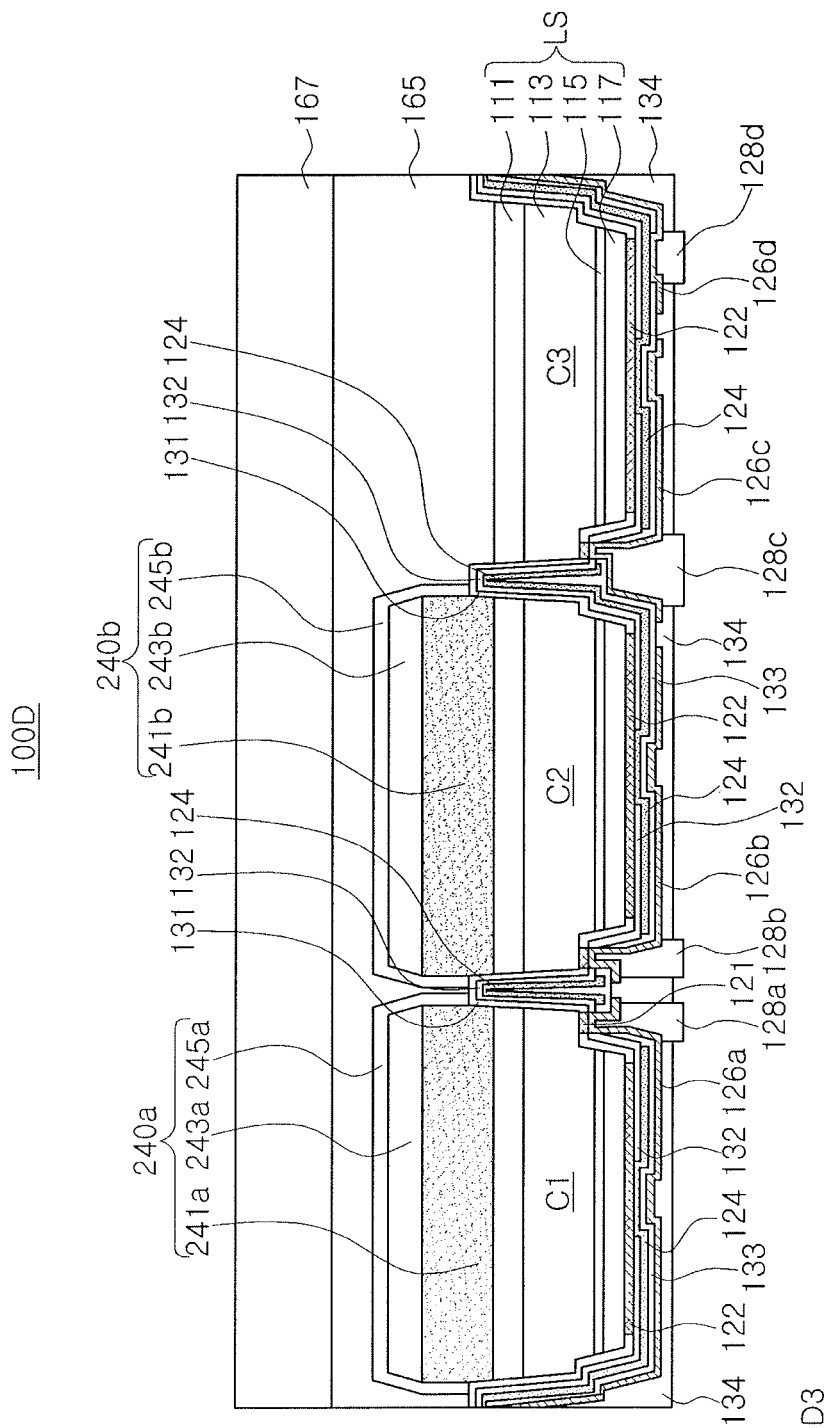
FIG. 22 illustrates a cross-sectional view of a light emitting device package according to an example embodiment.

FIG. 22 is a cross-sectional view of a light emitting device package 100D according to an example embodiment. The light emitting device package 100D illustrated in FIG. 22 may differ from the light emitting device package 100, described above with reference to FIGS. 1 through 3, in only the structure of first and second light adjusting portions 240a and 240b disposed on first to third light emitting cells C1 to C3. The remainder of the structure of the light emitting device package 100D may be the same as the structure of the light emitting device package 100. Thus, only the difference between the structures will hereinafter be briefly described.

The light emitting device package 100D may not include recess portions formed in a buffer layer 111, but may include a first wavelength conversion layer 241a and a second wavelength conversion layer 241b on the buffer layer 111. The first wavelength conversion layer 241a and the second wavelength conversion layer 241b may be overlapping, e.g., completely overlapping, the first and second light emitting cells C1 and C2, respectively.

The first wavelength conversion layer 241a may be previously fabricated in the form of a film including red QDs, and may be attached to the first light emitting cell C1. The second wavelength conversion layer 241b may be previously fabricated in the form of a film including green QDs, and may be attached to the second light emitting cell C2. The thicknesses of the first and second wavelength conversion layers 241a and 241b may range from 10 µm to 100 µm.

A first DBR layer 243a may cover the first wavelength conversion layer 241a, and a second DBR layer 243b may cover the second wavelength conversion layer 241b. The first DBR layer 243a and the second DBR layer 243b may have bottom surfaces that extend, e.g., completely extend, along an upper surface cover the first and second wavelength conversion layers 241a and 241b, respectively. The first DBR layer 243a and the second DBR layer 243b may have top surfaces that are narrower in the second direction D2 than the bottom surfaces thereof, such that lateral surfaces may be angled.

A first light filter layer 245a may be disposed on the first DBR layer 243a and may cover a lateral surface of the first wavelength conversion layer 241a, e.g., may extend from an upper surface thereof along lateral surfaces of the first DBR layer 243a, and the first wavelength conversion layer 241a in the third direction D3. A second light filter layer 245b may be disposed on the second DBR layer 243b and may cover a lateral surface of the second wavelength conversion layer 241b, e.g., may extend from an upper surface thereof along lateral surfaces of the second DBR layer 243b, and the second wavelength conversion layer 241b in the third direction D3. As may be seen therein, when the first insulating layer 131 protrudes above the first to third light emitting cells C1, C2, and C3, the first and second light filter layers 245a and 245b may be in contact with the first insulating layer 131 and do not entirely cover sidewalls of the first and second wavelength conversion layers 241a and 241b. When the first insulating layer 131 does not protrude, the first and second light filter layers 245a and 245b may be in contact with the first insulating layer 131 and entirely cover sidewalls of the first and second wavelength conversion layers 241a and 241b.

Figure 23:
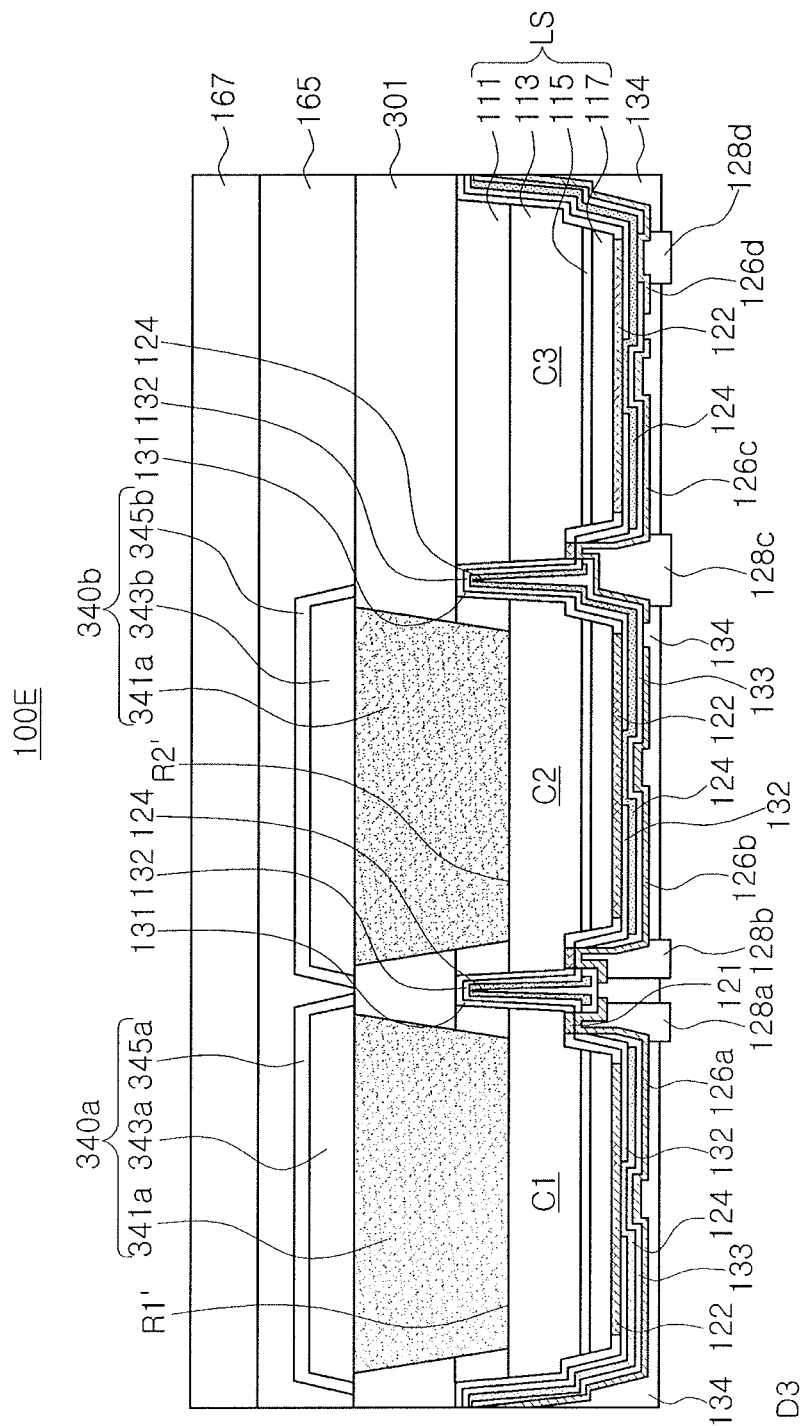
FIG. 23 illustrates a cross-sectional view of a light emitting device package according to an example embodiment.

FIG. 23 is a cross-sectional view of a light emitting device package 100E according to an example embodiment. The light emitting device package 100E illustrated in FIG. 23 may differ from the light emitting device package 100, described above with reference to FIGS. 1 through 3, only in the structure of first and second light adjusting portions 340a and 340b disposed on first to third light emitting cells C1 to C3 and in the inclusion of the transparent organic layer 150 and a light-transmitting substrate 301. The remainder of the structure of the light emitting device package 100E may be the same as the structure of the light emitting device package 100. Thus, only the difference between the structures will hereinafter be briefly described.

The light emitting device package 100E may include the light-transmitting substrate 301 disposed on a light emitting structure LS, and may also include first and second recess portions R1' and R2', formed by removing portions of the light-transmitting substrate 301 and a buffer layer 111. First and second wavelength conversion layers 341a and 341b may be disposed in the first and second recess portions R1' and R2', respectively. Unlike the components illustrated in FIG. 23, the first and second recess portions R1' and R2' may be variously modified. For example, the first and second recess portions R1' and R2' may be formed by removing portions of the light-transmitting substrate 301, or may have a depth that does not reach a first conductivity-type semiconductor layer 113. The depths of the first and second recess portions R1' and R2' may be variously modified within a range of 1 nm to 10 μm. A first DBR layer 343a may cover the first wavelength conversion layer 341a, and a second DBR layer 343b may cover the second wavelength conversion layer 341b. A first light filter layer 345a may be disposed on the first DBR layer 343a, and a second light filter layer 345b may be disposed on the second DBR layer 343b.

Figure 24:
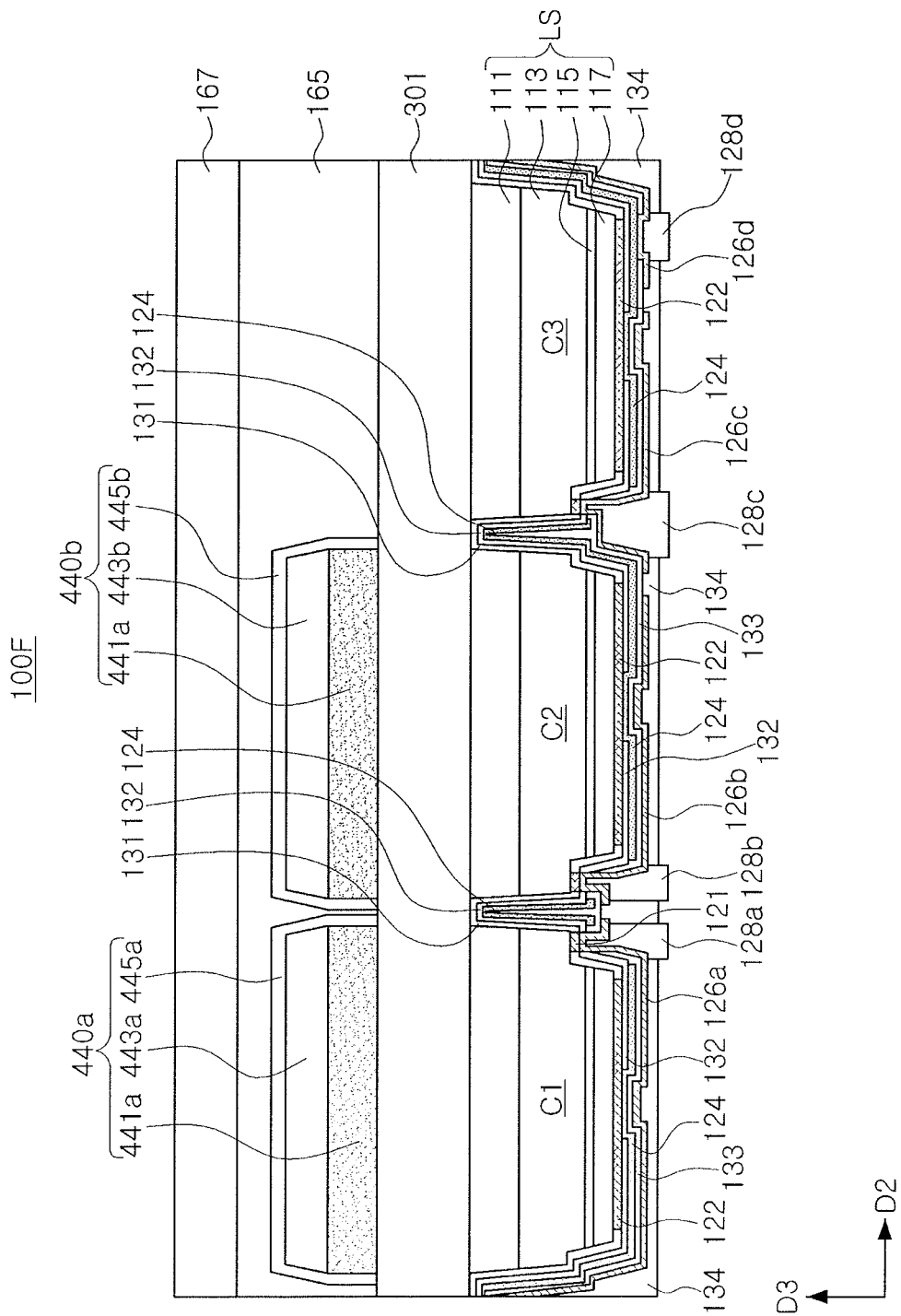
FIG. 24 illustrates a cross-sectional view of a light emitting device package according to an example embodiment.

FIG. 24 is a cross-sectional view of a light emitting device package 100F according to an example embodiment. The light emitting device package 100F illustrated in FIG. 24 may differ from the light emitting device package 100, described above with reference to FIGS. 1 through 3, only in the structure of first and second light adjusting portions 440a and 440b disposed on first to third light emitting cells C1 to C3, rather than in recess portions, and in the inclusion of the transparent organic layer 150 and the light-transmitting substrate 301. The remainder of the structure of the light emitting device package 100F may be the same as the structure of the light emitting device package 100. Thus, only the difference between the structures will hereinafter be briefly described.

The light-transmitting substrate 301 may be disposed on a light emitting structure LS. The light emitting device package 100F may include a first wavelength conversion layer 441a and a second wavelength conversion layer 441b disposed on the light-transmitting substrate 301. The first wavelength conversion layer 441a may be previously fabricated in the form of a film including red QDs. and may be attached to and overlapping the first light emitting cell C1 along the third direction D3. The second wavelength conversion layer 441b may be previously fabricated in the form of a film including green QDs, and may be attached to and overlapping the second light emitting cell C2 along the third direction D3. The thicknesses of the first and second wavelength conversion layers 441a and 441b may range from 10 m to 100 μm. A first DBR layer 443a may cover the first wavelength conversion layer 441a, and a second DBR layer 443b may cover the second wavelength conversion layer 441b. A first light filter layer 445a may be disposed on the first DBR layer 443a and may cover a lateral surface of the first wavelength conversion layer 441a. A second light filter layer 445b may be on the second DBR layer 443b and may cover a lateral surface of the second wavelength conversion layer 441b. In other words, the structure of the first and second light adjusting portions 440a and 440b may correspond to that of the first and second light adjusting portions 240a and 240b of FIG. 22, but secured to the light-transmitting substrate 301, rather than directly to the light emitting cells.

Figure 25:
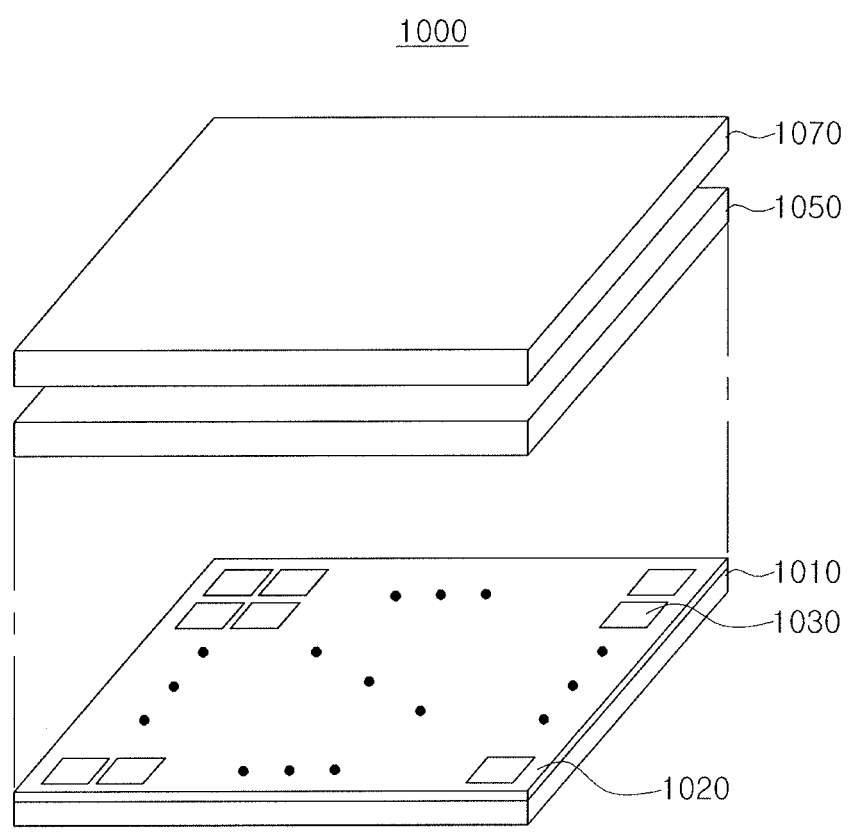
FIG. 25 illustrates a schematic perspective view of a display panel according to an example embodiment.

FIG. 25 is a schematic perspective view of a display panel 1000 according to an example embodiment. Referring to FIG. 25, the display panel 1000 may include a circuit board 1010, including a driver circuit for driving pixels 1030 and a control circuit for controlling the driver circuit, the pixels 1030 arranged on the circuit board 1010 in a plurality of rows and columns, a protective layer 1050, and a polarizing layer 1070. A black matrix 1020 may be disposed around the pixels 1030. The light emitting device packages according to example embodiments may be employed in the pixels 1030. Here, the sizes and pitches of the pixels 1030 may be reduced, and a high-resolution image may thus be displayed. When the light emitting device package 100, 100A, 100B, or 100C according to an example embodiment is employed in the pixels 1030, the three light emitting cells C1, C2, and C3 may be provided as three subpixels.

Figure 26:
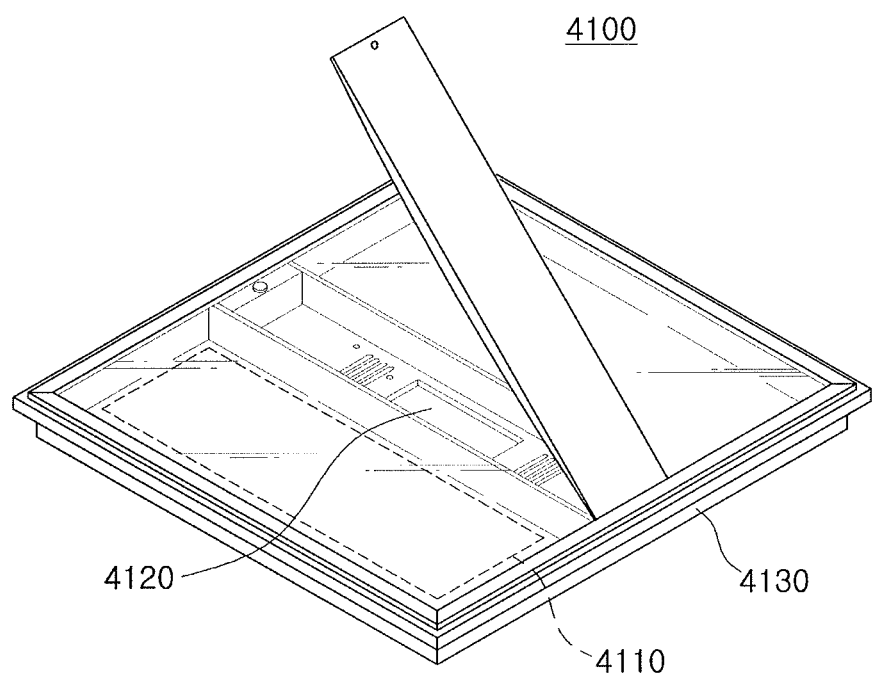
FIG. 26 illustrates a perspective view of a flat lighting device according to an example embodiment.

FIG. 26 is a perspective view of a flat lighting device 4100 according to an example embodiment. Referring to FIG. 26, the flat lighting device 4100 may include a light source module 4110, a power supply 4120, and a housing 4130. According to an example embodiment, the light source module 4110 may include a light emitting device array as a light source, and the power supply 4120 may include a light emitting device driver.

The light source module 4110 may include a light emitting device array and may have an overall planar shape. The light emitting device array may include a light emitting device and a controller, storing driving information of the light emitting device. The light emitting device may include the light emitting device packages according to example embodiments described above.

The power supply 4120 may supply power to the light source module 4110. The housing 4130 may have a space receiving the light source module 4110 and the power supply 4120 therein and may have a hexahedral shape with an open side surface thereof, but embodiments are not limited thereto. The light source module 4110 may emit light to the open side surface of the housing 4130.

Figure 27:
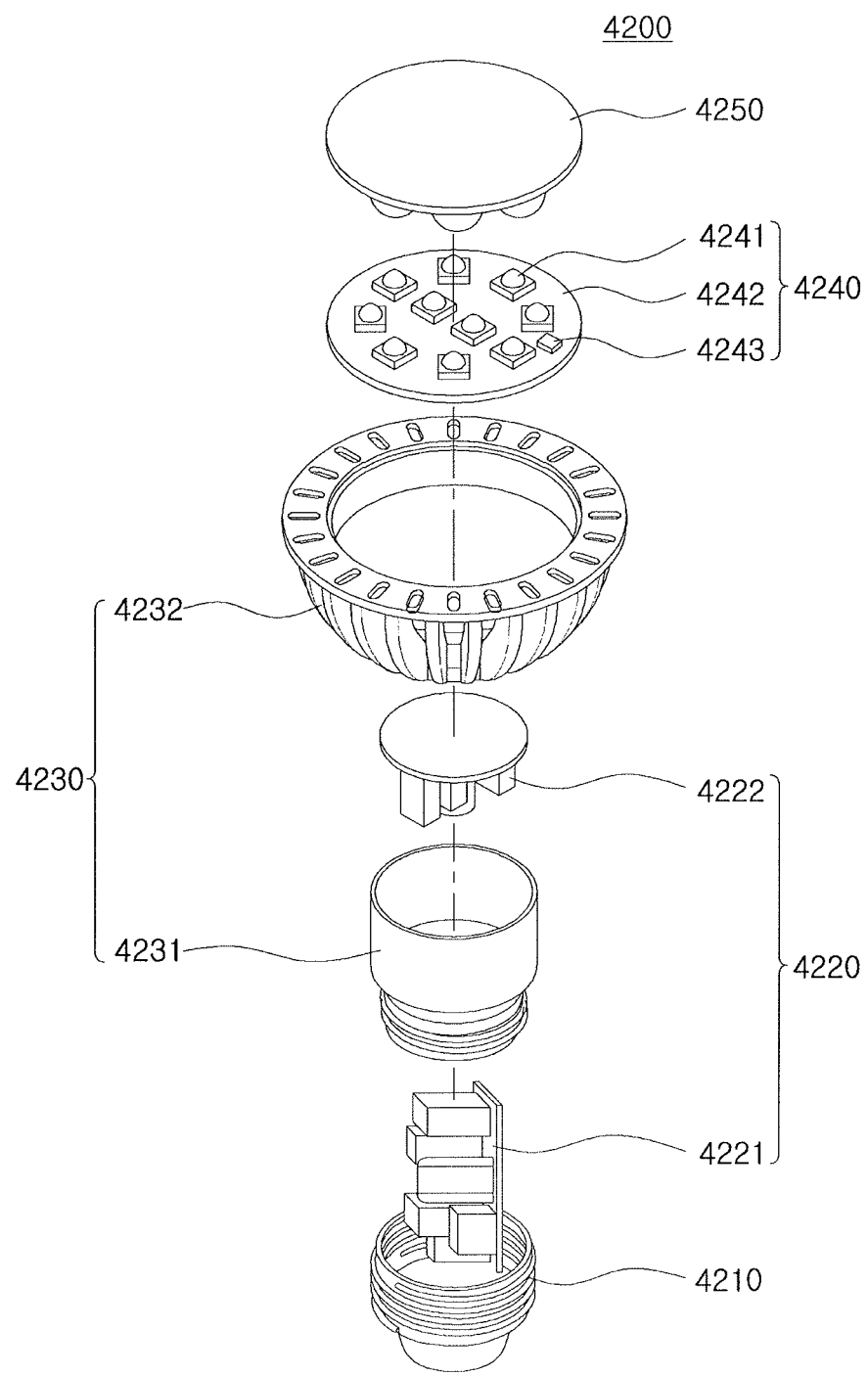
FIG. 27 illustrates an exploded perspective view of a bulb-type lamp according to an example embodiment.

FIG. 27 is an exploded perspective view of a bulb-type lamp according to an example embodiment. Referring to FIG. 27, a lighting device 4200 may include a socket 4210, a power supply 4220, a heat dissipation portion 4230, a light source module 4240, and an optical portion 4250. The light source module 4240 may include a light emitting device array, and the power supply 4220 may include a light emitting device driver.

The socket 4210 may replace that of a conventional lighting device. Power supplied to the lighting device 4200 may be applied through the socket 4210. As illustrated in FIG. 27, the power supply 4220 may be attached to a first power supply 4221 and a second power supply 4222. The heat dissipation portion 4230 may include an internal heat dissipation portion 4231 and an external heat dissipation portion 4232. The internal heat dissipation portion 4231 may be directly connected to the light source module 4240 or to the power supply 4220, to thus transfer heat to the external heat dissipation portion 4232. The optical portion 4250 may evenly scatter light emitted by the light source module 4240.

The light source module 4240 may receive power from the power supply 4220 to emit light to the optical portion 4250. The light source module 4240 may include at least one light emitting device 4241, a circuit board 4242, and a controller 4243, and the controller 4243 may store driving information of the at least one light emitting device 4241. The light emitting device packages according to example embodiments may be employed in the at least one light emitting device 4241.

Figure 28:
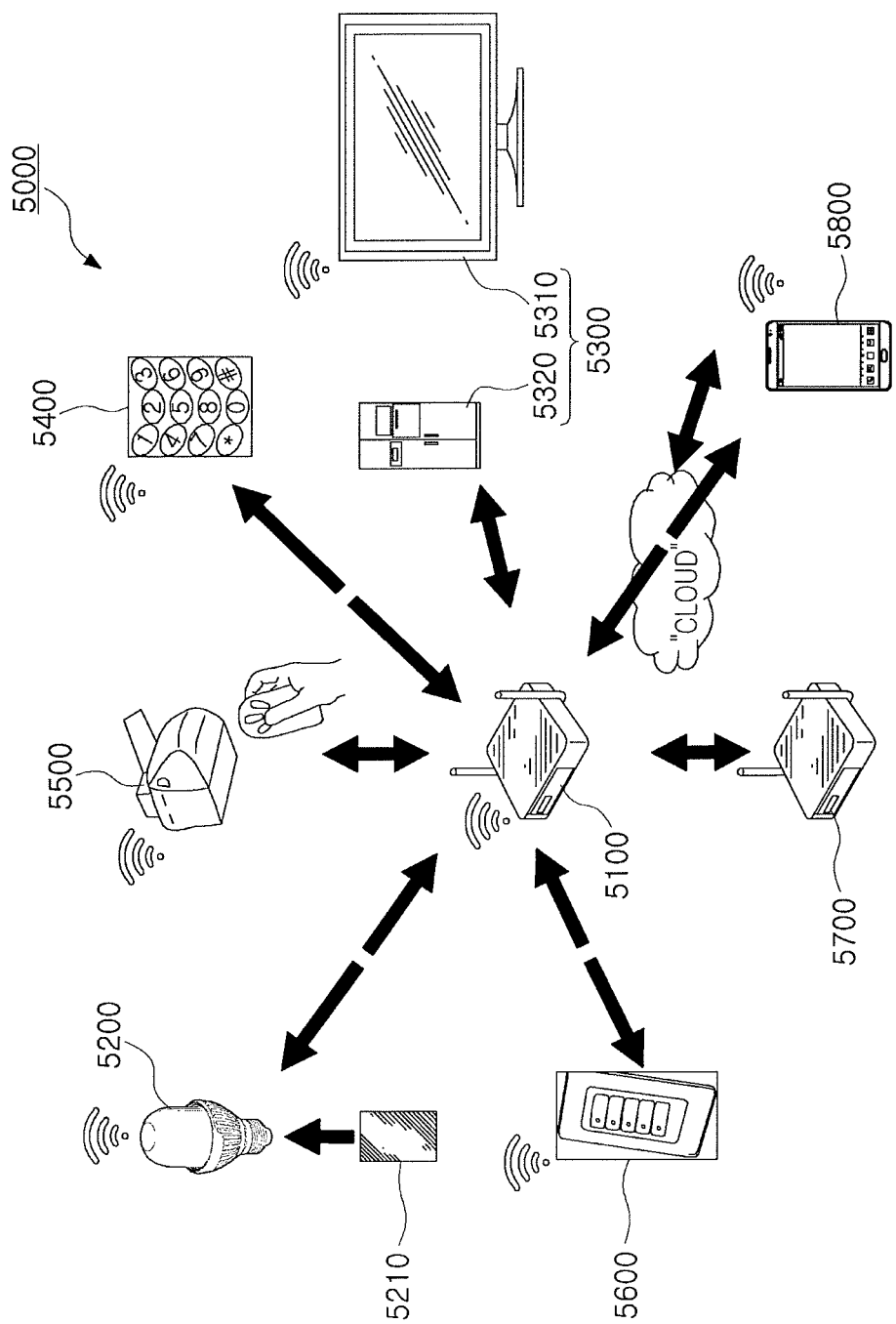
FIG. 28 illustrates a schematic view of an indoor lighting control network system according to an example embodiment.

FIG. 28 is a schematic view of an indoor lighting control network system according to an example embodiment. Referring to FIG. 28, a network system 5000 according to an example embodiment may be a complex smart lighting-network system in which lighting technology, Internet of things (IoT) technology, wireless communications technology, or the like, using a light emitting device such as an LED, converge. The network system 5000 may be realized using various types of lighting devices and wired/wireless communications devices, and may be realized by a sensor, a controller, a communications unit, software for network control and maintenance, or the like.

The network system 5000 may be applied to an open space, such as a park or a street, as well as to a closed space defined within a building, such as a home or an office. The network system 5000 may be implemented on the basis of an IoT environment to collect or process various pieces of information and provide the collected or processed information to a user. In this case, an LED lamp 5200 included in the network system 5000 may function to check and control operating states of other devices 5300, 5400, 5500, 5600, 5700, and 5800 included in the IoT environment on the basis of a function of the LED lamp 5200, such as visible light communications, or the like, as well as receive information regarding surroundings from a gateway 5100 to control lighting of the LED lamp 5200, itself.

Referring to FIG. 28, the network system 5000 may include the gateway 5100, processing data transmitted or received by different communications protocols, the LED lamp 5200, connected to the gateway 5100 to communicate therewith and including an LED, and the devices 5300 to 5800, connected to the gateway 5100 to communicate therewith according to various wireless communications schemes. To realize the network system 5000 on the basis of the IoT environment, each of the devices 5300 to 5800, as well as the LED lamp 5200, may include at least one communications module. As an example, the LED lamp 5200 may be connected to the gateway 5100 to communicate therewith by a wireless communications protocol such as wireless fidelity (Wi-Fi). Zigbee™, light fidelity (Li-Fi), or the like. To this end, the LED lamp 5200 may have at least one lamp communications module 5210.

As described above, the network system 5000 may be applied to an open space, such as a park or a street, as well as to a closed space, such as a home or an office. When the network system 5000 is applied to a home, the plurality of devices 5300 to 5800 included in the network system 5000 and connected to the gateway 5100 to communicate therewith on the basis of the IoT technology may include a home appliance 5300, such as a television 5310 or a refrigerator 5320, a digital door lock 5400, a garage door lock 5500, a lighting switch 5600 installed on a wall, or the like, a router 5700, relaying a wireless communications network, and a mobile device 5800, such as a smartphone, a tablet personal computer (PC), a laptop PC, or the like.

In the network system 5000, the LED lamp 5200 may check operating states of the various devices 5300 to 5800, or may automatically control luminance of the LED lamp 5200, itself, according to surroundings or circumstances of the devices 5300 or 5800, using a wireless communications network (Zigbee™, Wi-Fi, Li-Fi, or the like) installed in a home. Use of Li-Fi communications, using visible light emitted by the LED lamp 5200, may allow the devices 5300 to 4800 included in the network system 5000 to be controlled.

The LED lamp 5200 may automatically control the luminance of the LED lamp 5200 on the basis of information regarding its surroundings, transmitted from the gateway 5100 through the at least one lamp communications module 5210, or information regarding circumstances collected by a sensor mounted in the LED lamp 5200. For example, brightness of the LED lamp 5200 or brightness of images may be automatically controlled, according to a type of television program broadcast on the television 5310. To this end, the LED lamp 5200 may receive operational information of the television 5310 from the lamp communications module 5210 connected to the gateway 5100. The lamp communications module 5210 may be integrally modularized with a sensor or a controller included in the LED lamp 5200.

For example, when a program broadcast on the television 5310 is a drama, a color temperature of illumination may be decreased to be 12,000K or lower, to, for example, 5,000K, according to predetermined settings to control colors, thus creating a cozy atmosphere. In a different manner, when a program is a comedy, the network system 5000 may be configured such that a color temperature of illumination may be increased to 5.000K or higher and illumination may be adjusted to be white, based on blue light, according to predetermined settings.

In addition, after the digital door lock 5400 is locked without a person in a home, when a certain period of time has elapsed, all turned-on LED lamps 5200 may be turned off to prevent wastage of electricity. Alternatively, in a case in which a security mode is set by the mobile device 5800, or the like, when the digital door lock 5400 is locked without a person in a home, the LED lamp 5200 may remain turned on.

Operations of the LED lamp 5200 may also be controlled according to information regarding circumstances collected by various types of sensors connected to the network system 5000. For example, when the network system 5000 is operating in a building, a light, a position sensor, and a communications module may be combined with each other in the building to collect information on locations of people within the building, so that lights may be turned on or off or the collected information may be provided to a user in real time, thus enabling more efficient facility management or use of idle space. In general, since a lighting device such as the LED lamp 5200 may be disposed in almost all of the spaces on each floor of a building, various pieces of information within the building may be collected by a sensor integrated with the LED lamp 5200, and the collected information, again, may be used for management of facilities, utilization of idle space, or the like.

The LED lamp 5200 may be combined with an image sensor, a storage device, the lamp communications module 5210, or the like, so as to be utilized as a device that may maintain building security or detect and deal with an emergency. For example, when a smoke or temperature sensor, or the like, is attached to the LED lamp 5200, a fire, or the like, may be promptly detected to significantly reduce damage. In addition, brightness of lighting may be controlled in consideration of external weather or an amount of sunshine, thus saving energy and providing a comfortable lighting environment.

The LED lamp 5200, the television 5310, the refrigerator 5320, and the mobile device 5800 may include the light emitting device packages according to example embodiments described in this application.

As set forth above, according to the example embodiments, a light emitting device package having a compact size and by which various colors of light may be implemented, may be provided. Further, a light emitting device package having a compact size, improved light conversion efficiency, and enhanced reliability, may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device package, comprising:
   a light emitting structure having a first surface and a second surface opposing each other, the light emitting structure including a first light emitting cell and a second light emitting cell;
   an insulating layer covering a lateral surface of the first light emitting cell and a lateral surface of the second light emitting cell;
   a reflective layer on the insulating layer and covering the lateral surface of the first light emitting cell and the lateral surface of the second light emitting cell;
   a first light adjusting portion including a first wavelength conversion layer to output light of a first wavelength and a first distributed Bragg reflector (DBR) layer on the first wavelength conversion layer on the first light emitting cell; and
   a second light adjusting portion including a second wavelength conversion layer to output light of a second wavelength and a second DBR layer on the second wavelength conversion layer on the second light emitting cell.

2. The light emitting device package as claimed in claim 1, wherein:
   the light emitting structure further includes a third light emitting cell, and
   the insulating layer and the reflective layer cover a lateral surface of the third light emitting cell.

3. The light emitting device package as claimed in claim 1, wherein:
   the first wavelength conversion layer has red quantum dots, and
   the second wavelength conversion layer has green quantum dots.

4. The light emitting device package as claimed in claim 3, wherein:
   the first wavelength conversion layer is in a first recess portion of the first light emitting cell, and
   the second wavelength conversion layer is in a second recess portion of the second light emitting cell.

5. The light emitting device package as claimed in claim 4, wherein:
   a thickness of the first wavelength conversion layer is equal to a depth of the first recess portion, and
   a thickness of the second wavelength conversion layer is equal to a depth of the second recess portion.

6. The light emitting device package as claimed in claim 3, wherein:
   the first light emitting cell and the second light emitting cell emit blue light, and
   the first DBR layer and the second DBR layer reflect blue light.

7. The light emitting device package as claimed in claim 6, wherein:
   the first light adjusting portion further includes a first light filter layer on the first DBR layer,
   the second light adjusting portion further includes a second light filter layer on the second DBR layer, and
   the first light filter layer and the second light filter layer block blue light.

8. The light emitting device package as claimed in claim 6, wherein:
   the first light adjusting portion further includes a first light filter layer on the first DBR layer to selectively transmit red light, and
   the second light adjusting portion further includes a second light filter layer on the second DBR layer to selectively transmit green light.

9. The light emitting device package as claimed in claim 3, further comprising:
   a third light emitting cell included in the light emitting structure; and
   a third light adjusting portion in a third recess portion of the third light emitting cell provided on the second surface of the light emitting structure, the third light adjusting portion being to output blue light.

10. The light emitting device package as claimed in claim 9, wherein the third light adjusting portion includes a third wavelength conversion layer in the third recess portion and having blue quantum dots.

11. The light emitting device package as claimed in claim 10, wherein:
    the first light emitting cell, the second light emitting cell, and the third light emitting cell emit ultraviolet light,
    the third light adjusting portion includes a third DBR layer on the third wavelength conversion layer, and
    the first DBR layer, the second DBR layer, and the third DBR layer reflect ultraviolet light.

12. The light emitting device package as claimed in claim 11, wherein the first light adjusting portion, the second light adjusting portion, and the third light adjusting portion further include a first light filter layer, a second light filter layer, and a third light filter layer, on the first DBR layer, the second DBR layer, and the third DBR layer, respectively, to selectively block ultraviolet light.

13. A light emitting device package, comprising:
    a light emitting structure including a first light emitting cell, a second light emitting cell, and a third light emitting cell;
    a first light adjusting portion including a first wavelength conversion layer disposed in a first recess portion of the first light emitting cell;
    a second light adjusting portion including a second wavelength conversion layer disposed in a second recess portion of the second light emitting cell;
    an insulating layer on lateral surfaces between the first light emitting cell, the first wavelength conversion layer, the second light emitting cell, the second wavelength conversion layer, and the third light emitting cell, to separate the first light emitting cell, the first wavelength conversion layer, the second light emitting cell, the second wavelength conversion layer, and the third light emitting cell from one another, the insulating layer overlapping each of the first and second wavelength conversion layers in a direction parallel to an upper surface of the first wavelength conversion layer;
    a reflective layer on the insulating layer and between the first light emitting cell, the second light emitting cell, and the third light emitting cell; and
    a protective layer on the first light emitting cell, the second light emitting cell, and the third light emitting cell, and covering the first light adjusting portion and the second light adjusting portion.

14. The light emitting device package as claimed in claim 13, wherein:
- a thickness of the first wavelength conversion layer is equal to a depth of the first recess portion, and
- a thickness of the second wavelength conversion layer is equal to a depth of the second recess portion.

15. A light emitting device package, comprising:
- a light emitting structure including a first light emitting cell, a second light emitting cell, and a third light emitting cell, each of the first to third light emitting cells including an active layer to emit light of a first wavelength in a first direction and being separated from each other in a second direction, orthogonal to the first direction;
- a first light adjusting portion including a first wavelength conversion layer in a first recess portion of the first light emitting cell, the first recess portion being defined by a first layer directly on and contacting the first light emitting cell, the first wavelength conversion layer to convert light of the first wavelength to light of a second wavelength; and
- a second light adjusting portion including a second wavelength conversion layer in a second recess portion of the second light emitting cell, the second recess portion being defined by a second layer directly on and contacting the second light emitting cell, the second wavelength conversion layer to convert light of the first wavelength to light of a third wavelength.

16. The light emitting device package as claimed in claim 15, wherein the second wavelength is red light and the third wavelength is green light.

17. The light emitting device package as claimed in claim 16, wherein the first wavelength is blue light.

18. The light emitting device package as claimed in claim 15, further comprising:
- a third light adjusting portion including a third wavelength conversion layer in a third recess portion of the third light emitting cell, the third wavelength conversion layer to convert light of the first wavelength to light of a fourth wavelength, wherein
- the first wavelength is ultraviolet light, and
- the fourth wavelength is blue light.

19. The light emitting device package as claimed in claim 15, further comprising:
- an insulating layer on lateral surfaces between the first light emitting cell, the first layer, the second light emitting cell, the second layer, and the third light emitting cell, to separate the first light emitting cell, the second light emitting cell, and the third light emitting cell from one another in the second direction.

20. The light emitting device package as claimed in claim 19, further comprising:
- a reflective layer on lateral surfaces of the insulating layer in the second direction and between the first light emitting cell, the second light emitting cell, and the third light emitting cell, the reflective layer being separated from the first light emitting cell, the second light emitting cell, and the third light emitting cell by the insulating layer, wherein the reflective layer extends below the first to third light emitting cells and serves as a common electrode.

* * * * *

UNITED STATES PATENT AND TRADEMARK OFFICE
CERTIFICATE OF CORRECTION

PATENT NO. : 10,763,399 B2
APPLICATION NO. : 15/684144
DATED : September 1, 2020
INVENTOR(S) : Dong Gun Lee et al.

It is certified that error appears in the above-identified patent and that said Letters Patent is hereby corrected as shown below:

On the Title Page

Item (56) References Cited, page 2, Column 2:
2016/0059221 A1 3/2016 Brazdil et al.
To read:
-- 2016/0005922 A1 1/2016 Huang et al. --

Signed and Sealed this
Third Day of November, 2020

Andrei Iancu
*Director of the United States Patent and Trademark Office*